United States Patent [19]
Hardwick et al.

[11] Patent Number: 5,517,511
[45] Date of Patent: May 14, 1996

[54] DIGITAL TRANSMISSION OF ACOUSTIC SIGNALS OVER A NOISY COMMUNICATION CHANNEL

[75] Inventors: John C. Hardwick, Somerville; Jae S. Lim, Winchester, both of Mass.

[73] Assignee: Digital Voice Systems, Inc., Burlington, Mass.

[21] Appl. No.: 982,937

[22] Filed: Nov. 30, 1992

[51] Int. Cl.⁶ ................................................. G06F 11/08
[52] U.S. Cl. ................ 371/37.4; 364/265.2; 364/DIG.1
[58] Field of Search ........................ 371/37.1, 37.4, 371/56; 370/82; 375/45, 46, 47, 52, 64, 67, 68, 83, 90, 243, 261, 268, 269, 271, 272, 273, 274, 279, 303; 381/36, 265; 364/265, 265.1, 265.2, 944.5

[56] References Cited

U.S. PATENT DOCUMENTS

| | | | |
|---|---|---|---|
| 2,949,505 | 8/1960 | Kretzmer | 395/2.39 |
| 3,674,939 | 7/1972 | Brooks | 395/2.14 |
| 3,982,070 | 9/1976 | Flanagan | |
| 4,047,151 | 9/1977 | Rydbeck et al. | 371/41 |
| 4,074,228 | 2/1978 | Jonscher | |

(List continued on next page.)

FOREIGN PATENT DOCUMENTS

| | | | |
|---|---|---|---|
| 5625853 | 3/1981 | Japan | H04L 1/10 |
| 123747 | 8/1982 | Japan | H04L 1/00 |
| 6348030 | 2/1988 | Japan | H04L 11/08 |

OTHER PUBLICATIONS

Mazor et al "Transform Subbands Coding with Channel Error Control." IEEE 1989 pp. 172–175.
Hardwick et al "A 4.8 KPPS Multi–Band Excitation Speech Coder" IEEE 1988 pp. 374–377.
Brandstein et al. "A Real–Time Implementation of the Improved MBE Speech Coder" IEEE 1990 pp. 5–8.
Levesque et al. "A proposed Federal standard for Narrow Land Digital Land Mobile Radio" IEEE 1990 pp. 497–501.
Atungsiri et al "Error Detection and Control for The Parametric Information in Celp Coders" IEEE 1990 pp. 229–232.
Yu et al. "Discriminant Analysis and Supervised Vector Quantization For Continuous Speech Recognition" IEEE 1990 pp. 685–688.
J. L. Flanagan, Speech Analysis, Synthesis and Perception, Springer–Verlag, 1972, pp. 378–386.
Quatieri et al., "Speech Transformations Based on a Sinusoidal Representation", IEEE TASSP, vol. ASSP34, No. 6, Dec. 1986, pp. 1449–1986.

(List continued on next page.)

*Primary Examiner*—Robert W. Beausoliel, Jr.
*Assistant Examiner*—Albert Decady
*Attorney, Agent, or Firm*—Fish & Richardson

[57] ABSTRACT

The performance of digital communication over a noisy communication channel is improved. An encoder combines bit modulation with error control encoding to allow the decoder to use the redundancy in the error control codes to detect uncorrectable bit errors. This method improves the efficiency of the communication system since fewer bits are required for error control, leaving more bits available for data. In the context of a speech coding system, speech quality is improved without sacrificing robustness to bit errors. A bit prioritization method further improves performance over noisy channels. Individual bits in a set of quantizer values are arranged according to their sensitivity to bit errors. Error control codes having higher levels of redundancy are used to protect the most sensitive (highest priority) bits, while lower levels of redundancy are used to protest less sensitive bits. This method improves efficiency of the error control system, since only the highest priority data is encoded with the highest levels of redundancy. The effect of uncorrectable bit errors is reduced by adaptively smoothing the spectral parameters in a speech decoder. The amount of smoothing is varied depending upon the number of errors detected during the error control decoding of the received data. More smoothing is used when a large number of errors are detected, thereby reducing the perceived effect of any uncorrectable bit errors which may be present.

20 Claims, 18 Drawing Sheets

U.S. PATENT DOCUMENTS

| | | | |
|---|---|---|---|
| 4,216,354 | 8/1980 | Esteban et al. | 395/2.14 |
| 4,232,194 | 11/1980 | Adams | 380/28 |
| 4,276,647 | 6/1981 | Thacker et al. | 371/40.1 |
| 4,622,680 | 11/1986 | Zinser | 395/2.14 |
| 4,648,091 | 3/1987 | Gajjar | 371/37.1 |
| 4,744,086 | 5/1988 | Komly et al. | 371/40.1 |
| 4,799,059 | 1/1989 | Grindahl et al. | |
| 5,007,094 | 4/1991 | Hsuch et al. | |
| 5,023,910 | 6/1991 | Thomson | 381/37 |
| 5,036,515 | 7/1991 | Freeburg | 371/5.2 |
| 5,042,069 | 8/1991 | Chhatwal et al. | 395/2.38 |
| 5,081,681 | 1/1992 | Hardwick et al. | 381/51 |
| 5,095,392 | 3/1992 | Shimazaki et al. | 360/40 |
| 5,224,167 | 6/1993 | Taniguchi et al. | 395/2.36 |
| 5,247,579 | 9/1993 | Hardwick et al. | 371/37.4 |
| 5,263,088 | 11/1993 | Hazu et al. | 395/2.38 |
| 5,285,498 | 2/1994 | Johnston | 395/2.12 |
| 5,295,159 | 3/1994 | Kerpez | 375/38 |
| 5,410,553 | 4/1995 | Choon | 371/31 |

OTHER PUBLICATIONS

Griffin, "Multiband Excitation Vocoder", Ph.D. Thesis, M. I. T., 1987.

Griffin et al., "A High Quality 9.6 kbps Speech Coding System", Proc. ICASSP 86, pp. 125–128, Tokyo, Japan, Apr. 13–20, 1986.

Griffin et al., "A New Model–Based Speech Analysis/Synthesis System", Proc. ICASSP 85, pp. 513–516, Tampa, Florida, Mar. 26–29, 1985.

Hardwick, "A 4.8 kbps Multi–Band Excitation Speech Coder", S. M. Thesis, M. I. T., May 1988.

McAulay et al., "Mid–Rate Coding Based on a Sinusoidal Representation of Speech", Proc. ICASSP 85, pp. 945–948, Tampa, Florida, Mar. 26–29, 1985.

Campbell et al., "CELP Coding for Land Mobile Radio Applications", Proc. ICASSP 90, pp. 465–468, Albequerque, New Mexico, Apr. 3–6, 1990.

Levesque et al., *Error–Control Techniques for Digital Communications,* Wiley, 1985.

Jayant et al., *Digital Coding of Waveforms,* Prentice–Hall, 1984.

Digital Voice Systems, Inc., "INMARSAT–M Voice Coder", Version 1.9, Nov. 18, 1992.

DIGITAL TRANSMISSION OF ACOUSTIC SIGNALS OVER A NOISY COMMUNICATION CHANNEL

BACKGROUND OF THE INVENTION

This invention relates to methods for preserving the quality of speech or other acoustic signals when transmitted over a noisy channel.

Relevant publications include: J. L. Flanagan, Speech Analysis, Synthesis and Perception, Springer-Verlag, 1972, pp. 378–386, (discusses phase vocoder—frequency-based speech analysis-synthesis system); Quatieri, et al., "Speech Transformations Based on a Sinusoidal Representation", IEEE TASSP, Vol, ASSP34, No. 6, Dec. 1986, pp. 1449–1986, (discusses analysis-synthesis technique based on a sinusoidal representation); Griffin, "Multiband Excitation Vocoder", Ph. D. Thesis, M.I.T. 1987, (discusses an 8000 bps Multi-Band Excitation speech coder); Griffin, et al., "A High Quality 9.6 kbps Speech Coding System", Proc. ICASSP 86, pp. 125–128, Tokyo, Japan, Apr. 13–20, 1986, (discusses a 9600 bps Multi-Band Excitation speech coder); Griffin, et al., "A New Model-Based Speech Analysis/Synthesis System", Proc. ICASSP 85, pp. 513–516, Tampa, Fla., Mar. 26–29, 1985, (discusses Multi-Band Excitation speech model); Hardwick, "A 4.8 kbps Multi-Band Excitation Speech Coder", S. M. Thesis, M.I.T., May 1988, (discusses a 4800 bps Multi-Band Excitation speech coder); McAulay et al., "Mid-Rate Coding Based on a Sinusoidal Representation of Speech", Proc. ICASSP 85, pp. 945–948, Tampa, Fla., Mar. 26–29, 1985, (discusses the sinusoidal transform speech coder); Campbell et al., "The New 4800 bps Voice Coding Standard", Mil Speech Tech Conference, Nov. 1989, (discusses error correction in a U.S. Government speech coder); Campbell et al., "CELP Coding for Land Mobile Radio Applications", Proc. ICASSP 90, pp. 465–468, Albequerque, N.M. Apr. 3–6, 1990, (discusses error correction in a U.S. Government speech coder); Levesque et al., *Error-Control Techniques for Digital Communication,* Wiley, 1985 (discusses error correction in general); Lin et al., *Error Control Coding,* Prentice-Hall, 1983, (discusses error correction in general); Jayant et al., *Digital Coding of Waveforms,* Prentice-Hall, 1984, (discusses speech coding in general); Digital Voice Systems, Inc., "INMARSAT-M Voice Coder", Version 1.9, Nov. 18, 1992, (discusses 6.4 kbps IMBE™ speech coder for INMARSAT-M standard), Digital Voice Systems, Inc., "APCO/NASTD/Fed Project 25 Vocoder Description", Version 1.0, Dec. 1, 1992, (discusses 7.2 kbps IMBE™ speech coder for APCO/NASTD/Fed Project 25 standard) (Appendix A). The contents of these publications (including Appendix A) are incorporated herein by reference.

The problem of reliably transmitting digital data over noisy communication channels has a large number of applications, and as a result has received considerable attention in the literature. Traditional digital communication systems have relied upon error correction and detection methods to reliably transmit digital data over noisy channels. Sophisticated error coding techniques have been developed to systematically correct and detect bit errors which are introduced by the channel. Examples of commonly used error control codes (ECC's) include: Golay codes, Hamming codes, BCH codes, CRC codes, convolutional codes, Reed-Solomon codes, etc . . . . These codes all function by converting a set of information bits into a large number of bits which are then transmitted across the channel. The increase in the number of bits can be viewed as a form of redundancy which enables the receiver to correct and/or detect up to a certain number of bits errors. In traditional ECC methods the number of bits errors which can be corrected/detected is a function of the amount of redundancy which is added to the data. This results in a tradeoff between reliability (the number of bit errors which can be corrected) versus useable data rate (the amount of information which can be transmitted after leaving room for redundancy). The digital communication designer typically performs a sophisticated system analysis to determine the best compromise between the these two competing requirements.

The reliable transmission of speech or other acoustic signals over a communication channel is a related problem which is made more complicated by the need to first convert the analog acoustic signal into a digital representation. This is often done by digitizing the analog signal with an A-to-D convertor. In the case of speech, where an 8 bit A-to-D convertor may sample the signal at a rate of 8 kHz, the digital representation would require 64 kbps. If additional, redundant, information must be added prior to transmission across the channel, then the required channel data rate would be significantly greater than 64 kbps. For example, if the channel requires 50% redundancy for reliable transmission, then the required channel data rate would be 64+32=96 kbps. Unfortunately this data rate is beyond what is practical in many digital communication systems. Consequently some method for reducing the size of the digital representation is needed. This problem, commonly referred to as "compression", is performed by a signal coder. In the case of speech or other acoustic signals a system of this type is often referred to as a speech coder, voice coders, or simply a vocoder.

A modern speech coder performs a sophisticated analysis on the input signal, which can be viewed as either an analog signal or the output of an A-to-D converter. The result of this analysis is a compressed digital representation which may be as low as 100 bps. The actual compressed rate which is achieved is generally a function of the desired fidelity (i.e. speech quality) and the type of speech coder which is employed. Different types of speech codes have been designed to operate at high rates (16–64 kbps), mid-rates (2–16 kbps) and low rates (0–2 kbps). Recently, mid-rate speech coders have been the subject of renewed interest due to the increase in mobile communication services (cellular, satellite telephony, land mobile radio, in-flight phones, etc. . . ). These applications typically require high quality speech at mid-rates. In addition these applications are all subject to significant channel degradations including in high bit error rates (BER) of 1–10% and multipath fading. (Note the problem of bit errors is present to some extent in all digital communication and storage applications. The mobile communication example is presented due to the severity of the problem in the mobile environment).

As discussed above, there are numerous speech coding methods which have been employed in the past. One class of speech coders which have been extensively studied and used in practice is based on an underlying model of speech. Examples from this class of vocoders include linear prediction vocoders, homomorphic vocoders, sinusoidal transform coders, multi-band excitation speech coders, improved multi-band excitation speech coders and channel vocoders. In these vocoders, speech is characterized on a short-time basis through a set of model parameters. The model parameters typically consist of some combination of voiced/unvoiced decisions, voiced/unvoiced probability measure, pitch period, fundamental frequency, gain, spectral envelope parameters and residual or error parameters. For this class of speech coders, speech is analyzed by first segmenting speech using a window such as a Hamming window. Then, for each segment of speech, the model parameters are estimated and quantized.

In noisy digital communication systems, the traditional approach is to protect the quantized model parameters with some form of ECC. The redundant information associated with the ECC is used by the receiver to correct and/or detect bit errors introduced by the channel. The receiver then reconstructs the model parameters and then proceeds to synthesize a digital speech signal which is suitable for playback through a D-to-A convertor and a speaker. The inclusion of error control capability allows the receiver to reduce the distortion and other artifacts which would be introduced into the synthesized speech due to the presence of bit errors in the received data. Unfortunately, with any error control code, there is some probability that too many errors will be introduced for the receiver to correct. In this case the remaining bit errors will affect the reconstruction of the model parameters and possibly introduce significant degradations into the synthesized speech. This problem can be lessened by either including additional error control codes, or by including additional error detection capability which can be detect errors which cannot be corrected. These traditional approaches require additional redundancy and hence further increase the channel data rate which is required to transmit a fixed amount of information. This requirement is a disadvantage, since in most applications it is desirable to minimize the total number of bits which are transmitted (or stored).

The invention described herein applies to many different digital communication systems, some of which contain speech coders. Examples of speech coders which may be contained in such a communication system include but are not limited to linear predictive speech codes, channel vocoders, homomorphic vocoders, sinusoidal transform coders, multi-band excitation speech coders and improved multi-band excitation (IMBE™) speech coders. For the purpose of describing the details of this invention, we have focussed on a digital communication system containing the IMBE™ speech coder. This particular speech order has been standardized at 6.4 kbps for use over the INMARSAT-M (International Marine Satellite Organization) and OPTUS Mobiles at satellite communication system, and which has been selected at 7.2 kbps for use in the APCO/NASTD/Fed Project 25 North American land mobile radio standard.

The IMBE™ coder uses a robust speech model which is referred to as the Multi-Band Excitation (MBE) speech model. The MBE speech model was developed by Griffin and Lim in 1984. This model uses a more flexible representation of the speech signal than traditional speech models. As a consequence it is able to produce more natural sounding speech, and it is more robust to the presence of acoustic background noise. These properties have caused the MBE speech model to be used extensively for high quality mid-rate speech coding.

Let $s(n)$ denote a discrete speech signal obtained by sampling an analog speech signal. In order to focus attention on a short segment of speech over which the model parameters are assumed to be constant, the signal $s(n)$ is multiplied to a window $w(n)$ to obtain a windowed speech segment or frame, $s_w(n)$. The speech segment $s_w(n)$ is modelled as the response of a linear filter $h_w(n)$ to some excitation signal $e_w(n)$. Therefore, $S_w(\omega)$, the Fourier Transform of $s_w(n)$, can be expressed as $$S_w(\omega) = H_w(\omega) E_w(\omega) \quad (1)$$

where $H_w(\omega)$ are the Fourier Transforms of $h_w(n)$ and $e_w(n)$, respectively. The spectrum $H_w(\omega)$ is often referred to as the spectral envelope of the speech segment.

In traditional speech models speech is divided into two classes depending upon whether the signal is mostly periodic (voiced) or mostly noise-like (unvoiced). For voiced speech the excitation signal is a periodic impulse sequence, where the distance between impulses is the pitch period. For unvoiced speech the excitation signal is a white noise sequence.

In traditional speech models each speech segment is classified as either entirely voiced or entirely unvoiced. In contrast the MBE signal model divides the excitation spectrum into a number of non-overlapping frequency bands and makes a voiced or unvoiced (V/UV) decision for each frequency band. This approach allows the excitation signal for a particular speech segment to be a mixture of periodic (voiced) energy and a periodic (unvoiced) energy. This added flexibility in the modelling of the excitation signal allows the MBE speech model to produce high quality speech and to be robust to the presence of background noise.

Speech coders based in the MBE speech model estimate a set of model parameters for each segment of speech. The MBE model parameters consists of a fundamental frequency, a set of V/UV decisions which characterize the excitation signal, and a set of spectral amplitudes which characterize the spectral envelope. Once the MBE model parameters have been estimated for each segment, they are quantized, protected with ECC and transmitted to the decoder. The decoder then performs error control decoding to correct and/or detect bit errors. The resulting bits are then used to reconstruct the MBE model parameters which are in turn used to synthesize a speech signal suitable for playback through a D-to-A convertor and a conventional speaker.

SUMMARY OF THE INVENTION

In a first aspect, the invention features a new data encoding method which uses bit modulation to allow uncorrectable bit errors to be detected without requiring any further redundancy to be added to digital data stream. The digital data is first subdivided into contiguous frames. Then for each frame, a modulation key is generated from a portion of the digital data, which is in turn used to generate a unique modulation sequence. This sequence is then combined with the digital data after error control coding has been applied. A decoder which receives a frame of modulated data attempts to generate the correct demodulation key, demodulate the data and perform error control decoding. An error measure is computed by comparing the data before and after error control decoding. The value of the error measure indicates the probability that the demodulation key is incorrect. If the value of the error measure exceeds a threshold, then the decoder declares the current frame of digital data to be invalid and performs a frame repeat or some other appropriate action.

In a second aspect, the invention features a bit prioritization method which improves the reliability with which a set of quantizer values can be transmitted over a noisy communication channel. This new method assigns a weight to each bit location in a set of quantizer values. In any one quantizer value, the weight is greater for a more significant bit location than for a less significant bit location. The weight of bit locations of the same significance in different quantizer values varies depending upon the sensitivity of the different quantizer values to bit errors; more sensitive bit locations receiving a higher weight than less sensitive bit locations. The bits in each of the bit locations are then prioritized according to their weight, and the prioritized bits are then encoded with error control codes. Error control codes with higher redundancy are typically used to encode the higher priority (i.e. higher weight) bits, while lower redundancy error control codes are used to encode the lower priority (i.e. lower weight) bits. This method improves the efficiency of the error control codes, since only the most critical bits are protected with the high redundancy codes. The decoder which receives the prioritized data, performs error control decoding and then rearranges the bits, using the same weighting method, to reconstruct the quantizer values.

In a third aspect, the invention features an improved method for decoding and synthesizing an acoustic signal from a digital data stream. This method divides the digital data into contiguous frames each of which is associated with a time segment of the signal. The method then performs error control decoding of the digital data and then performs further decoding to reconstruct a frequency domain representation of the time segments. The number of errors detected in each frame is determined by comparing the data before and after error control decoding. The frequency domain representation is then smoothed depending upon the number of detected errors, and the smoothed representation is used to synthesize an acoustic signal. Typically the amount of smoothing is increased as the number of detected errors increases, and the amount of smoothing is decreased as the number of detected errors decreases. This method reduces the amount of degradation a listener perceives when hearing the synthesized acoustic signal if the digital data contains a substantial number of bit errors.

In a fourth aspect, the invention features a particular advantageous bit allocation for a 7.2 kbps speech coder and decoder. In such a system, each frame has 144 bits, which most be allocated to various parameters. We have discovered, after considerable experimentation, that a particularly advantageous allocation of these bits is as follows: 88 bits for the speech model parameters and 56 bits for error control coding. Preferably, the 88 bits allocated to speech model parameters is further allocated as follows: 8 bits for the fundamental frequency, K bits for the voiced/unvoiced decisions, and 79-K bits for the spectral amplitudes, and 1 bit for synchronization.

Other features and advantages of the invention will be apparent from the following description of preferred embodiments and from the claims.

BRIEF DESCRIPTION OF THE DRAWINGS

FIG. 9 shows a prefered embodiment of the invention in which the quantizer values representing the spectral amplitudes used in the 7.2 kbps IMBE™ speech coder are prioritized for $\hat{L}=16$.

DESCRIPTION OF PREFERRED EMBODIMENTS OF THE INVENTION

TABLE 1

Figure 1:
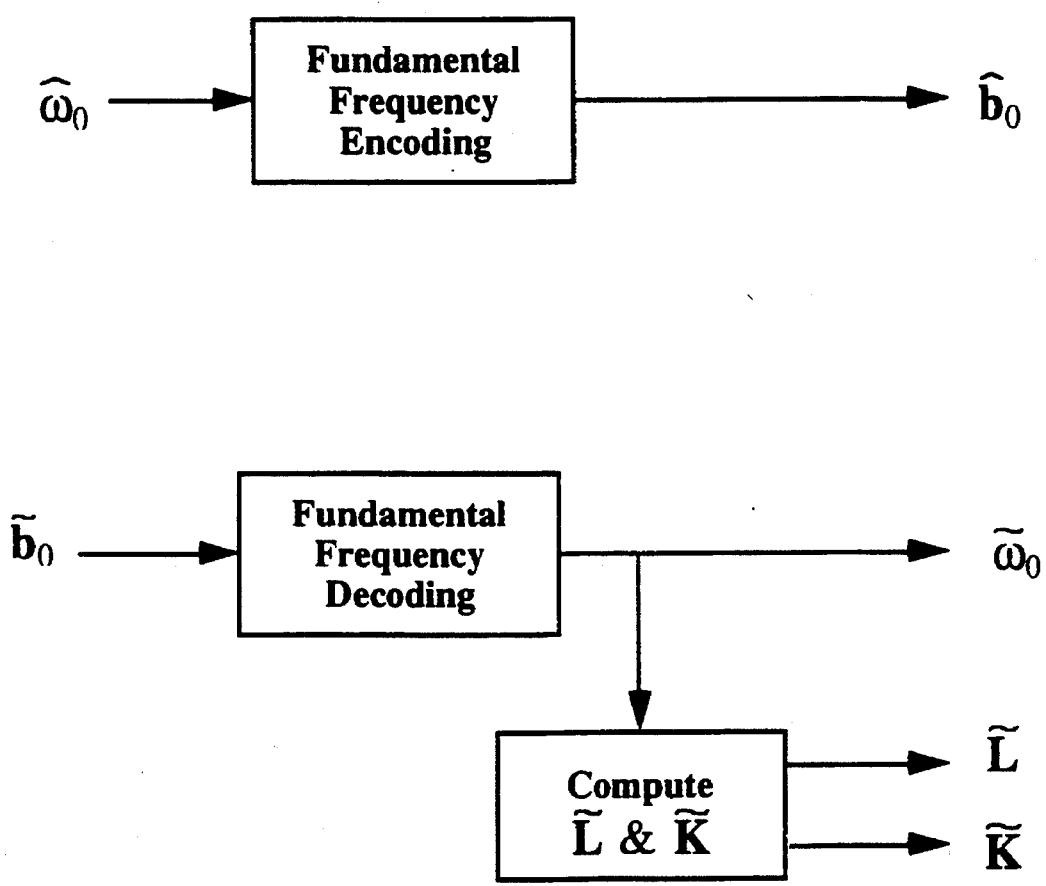
FIG. 1 is a block diagram showing a prefered embodiment of the invention in which the fundamental frequency used in the IMBE™ speech coder is encoded and decoded.

| Bit Allocation Among Model Parameters | |
|---|---|
| Parameter | Number of Bits |
| Fundamental Frequency | 8 |
| Voiced/Unvoiced Decisions | $\hat{K}$ |
| Spectral Amplitudes | 79 - $\hat{K}$ |
| Synchronization | 1 |

The preferred embodiment of the invention is described in the context of the 7.2 kbps IMBE™ speech coder adopted as the land mobile radio standard by APCO/NASTD/Fed Project 25. In the IMBE™ speech coder the speech signal is divided into segments and each segment is used to estimate a set of parameters which consist of the fundamental frequency, $\hat{\omega}_0$, the V/UV decisions, $\hat{v}_k$ for $1 \leq k \leq \hat{K}$, and the spectral amplitudes, $\hat{M}_l$ for $1 \leq l \leq \hat{L}$. A quantizer is then employed to reduce each set of model parameters to a frame of quantizer values, denoted by $\hat{b}_0, \hat{b}_1, \ldots, \hat{b}_{\hat{L}}+2$. Since the Project 25 speech coder is designed to operate at 7.2 kbps with a 20 ms. frame length, only 144 bits are available per frame. Of these 144 bits, 56 are reserved for error control, leaving only 88 bits to be divided over the frame of $\hat{L}+3$ quantizer values. These 88 bits must be used in a sophisticated manner to ensure that the MBE model parameters are transmitted with sufficient fidelity to allow the decoder to synthesize high quality speech. The method of achieving this goal is described in the following sections.

The encoder and decoder both allocate the 88 bits per frame in the manner shown in Table 1. This table highlights the fact that the bit allocation varies from frame to frame depending upon the number of model parameters. As will be described below, the exact bit allocation is fully determined by the six most significant bits of the pitch.

TABLE 2

| Eight Bit Binary Representation | |
|---|---|
| value | bits |
| 0 | 0000 0000 |
| 1 | 0000 0001 |
| 2 | 0000 0010 |
| . | . |
| . | . |
| . | . |
| 255 | 1111 1111 |

The fundamental frequency is estimated with one-quarter sample resolution in the interval $$\frac{2\pi}{123.125} \leq \hat{\omega}_0 \frac{2\pi}{19.875},$$

however, it is only encoded at half-sample resolution. This is accomplished by finding the value of $\hat{b}_0$ which satisfies:

$$\hat{b}_0 = \lfloor \frac{4\pi}{\hat{\omega}_0} - 39 \rfloor \quad (2)$$

The quantizer value $\hat{b}_0$ is represented with 8 bits using the unsigned binary representation shown in Table 2. This representation is used throughout IMBE™ speech coder.

The fundamental frequency is decoded and reconstructed at the receiver by using Equation (3) to convert $\tilde{b}_0$ to the received fundamental frequency $\tilde{\omega}_0$. In addition $\tilde{b}_0$ is used to calculate $\tilde{K}$ and $\tilde{L}$, the number of V/UV decisions and the number of spectral amplitudes, respectively. These relationships are given in Equations (4) and (5).

$$\tilde{\omega}_0 = \frac{4\pi}{\tilde{b}_0 + 39.5} \quad (3)$$

$$\tilde{L} = \lfloor .9254 \lfloor \frac{\pi}{\tilde{\omega}_0} + .25 \rfloor \rfloor \quad (4)$$

$$\tilde{K} = \begin{cases} \lfloor \frac{(\tilde{L}+2)}{3} \rfloor & \text{if } \tilde{L} \leq 36 \\ 12 & \text{otherwise} \end{cases} \quad (5)$$

A block diagram of the fundamental frequency encoding and decoding process is shown in FIG. 1.

Equation (4) shows that the parameter $\tilde{L}$ is only a function of the six most significant bits (MSB's) of the quantizer value $\tilde{b}_0$. As will be discussed below, the IMBE™ speech encoder and decoder interpret each frame using a variable frame format (i.e. variable bit allocation) which is specified by the parameters, $\hat{L}$ and $\tilde{L}$, respectively. Since for proper operation the frame format used by the encoder and decoder must be identical, it is extremely important that $\hat{L}=\tilde{L}$.

Because of this fact these six bits are considered the highest priority bits in the IMBE™ speech frame.

The V/UV decisions $\hat{v}_k$, for $1 \leq k \leq \hat{K}$, are binary values which classify each frequency band as either voiced or unvoiced. These values are encoded using $$\hat{b}_1 = \sum_{k=1}^{\hat{K}} \hat{v}_k 2^{K-k} \quad (6)$$

The quantizer value $\hat{b}_1$ is represented with $\hat{K}$ bits using an unsigned binary representation analogous to that shown in Table 2.

At the receiver the $\tilde{K}$ bits corresponding to $\tilde{b}_1$ are decoded into the V/UV decisions $\tilde{v}_l$ for $1 \leq l \leq \tilde{L}$. Note that this is a departure from the V/UV convention used by the encoder, which used a single V/UV decision to represent an entire frequency band. Instead the decoder uses a separate V/UV decision for each spectral amplitude. The decoder performs this conversion by using $\tilde{b}_1$ to determine which frequency bands are voiced or unvoiced. The state of $v_l$ is then set depending upon whether the frequency $\omega=l\cdot\omega_0$ is within a voiced or unvoiced frequency band. This can be expressed mathematically as shown in the following two equations.

$$\kappa_l = \begin{cases} \lfloor \frac{(l+2)}{3} \rfloor & \text{if } l \leq 36 \\ 12 & \text{otherwise} \end{cases} \quad (7)$$

$$\tilde{v}_l = \frac{\tilde{b}_1}{2^{K-\kappa_l}} - 2\frac{\tilde{b}_1}{2^{K+1-\kappa_l}} \quad \text{for } 1 \leq l \leq \tilde{L} \quad (8)$$

Figure 2:
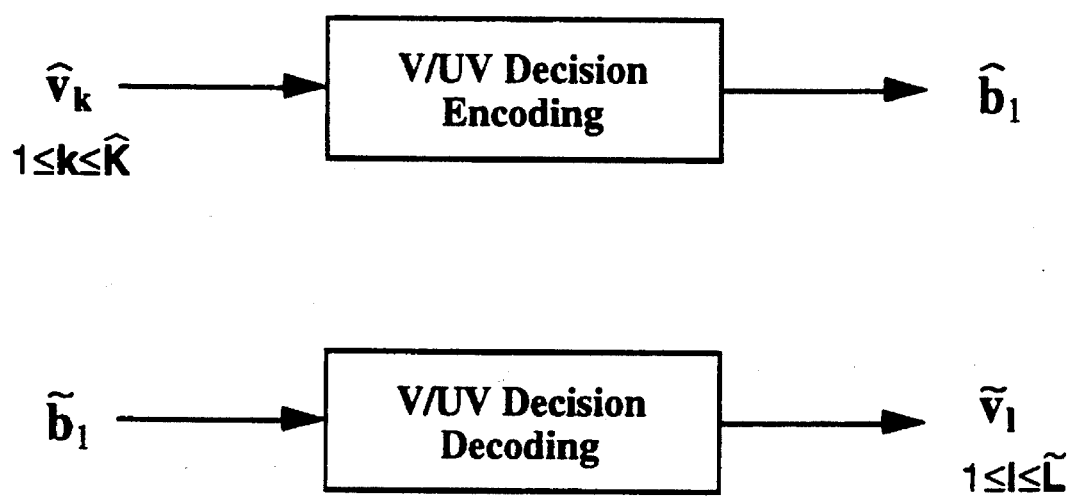
FIG. 2 is a block diagram showing a prefered embodiment of the invention in which the voiced/unvoiced decisions used in the IMBE™ speech coder are encoded and decoded.

FIG. 2 shows a block diagram of the V/UV decision encoding and decoding process.

Figure 3:
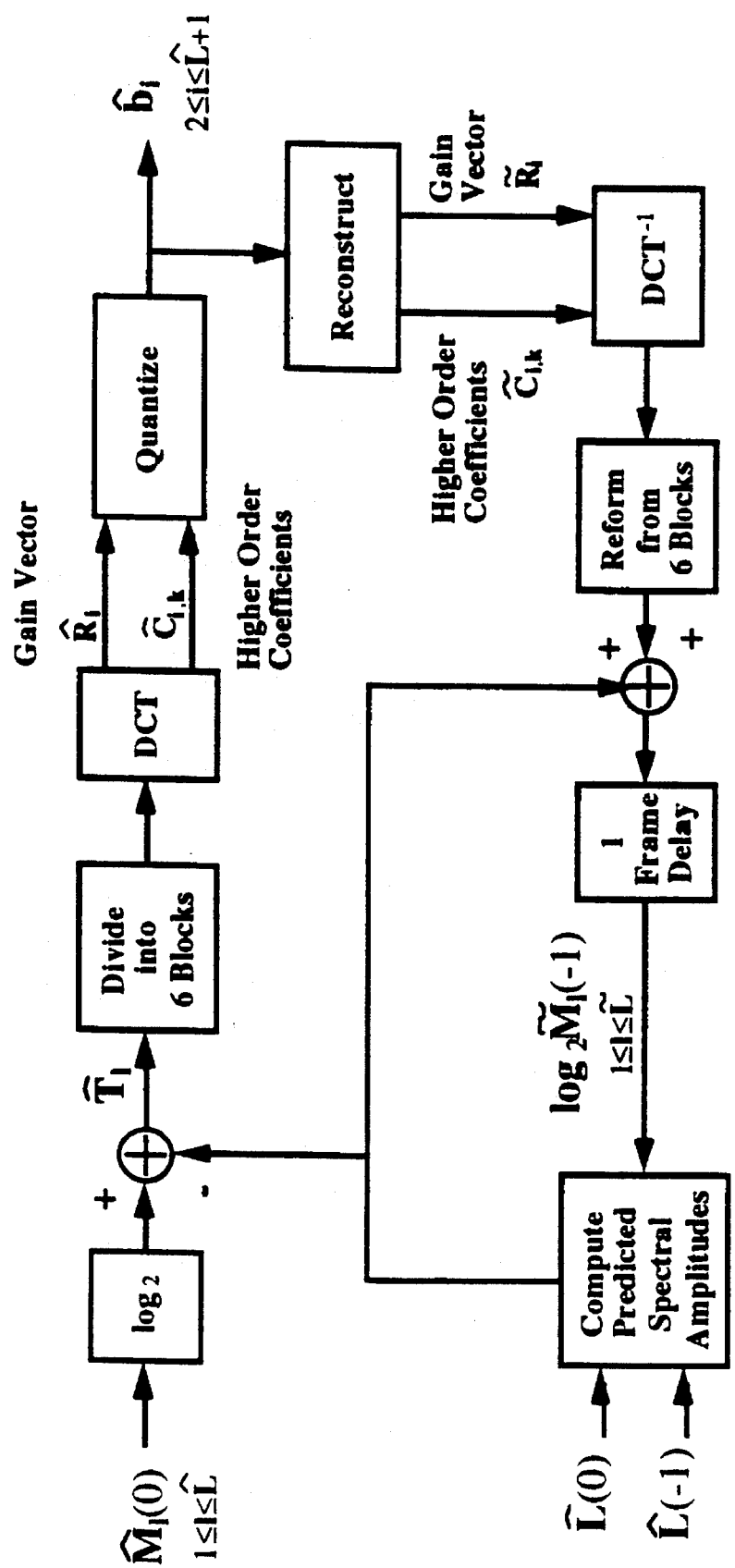
FIG. 3 is a block diagram showing a prefered embodiment of the invention in which the spectral amplitudes used in the IMBE™ speech coder are quantized into a set of quantizer values, denoted $\hat{b}_2$ through $\hat{b}_{\hat{L}}+1$.

The spectral amplitudes $\hat{M}_l$, for $1 \leq l \leq \hat{L}$, are real values which must be quantized prior to encoding. This is accomplished as shown in FIG. 3, by forming the spectral amplitude prediction residuals $\hat{T}_l$ for $1 \leq l \leq \hat{L}$, according to Equations (9) through (14). For the purpose of this discussion $\tilde{M}_l(0)$ refers to the unquantized spectral amplitudes of the current frame, while $\tilde{M}_l(-1)$ refers to the quantized spectral amplitudes of the previous frame. Similarly $\hat{L}(0)$ refers to the number of harmonics in the current frame, while $\hat{L}(-1)$ refers to the number of harmonics in the previous frame.

$$\hat{k}_l = \frac{\hat{L}(-1)}{\hat{L}(0)} \cdot l \quad (9)$$

$$\hat{\delta}_l = \hat{k}_l - \lfloor \hat{k}_l \rfloor \quad (10)$$

$$\hat{T}_l = \log_2 \hat{M}_l(0) - \rho(1-\hat{\delta}_l)\log_2 \tilde{M}_{\lfloor \hat{k}_l \rfloor}(-1) - \quad (11)$$

$$\rho \hat{\delta}_l \log_2 \tilde{M}_{\lfloor \hat{k}_l \rfloor+1}(-1) +$$

$$\frac{\rho}{\hat{L}(0)} \sum_{\lambda=1}^{\hat{L}(0)} (1-\hat{\delta}_\lambda)\log_2 \tilde{M}_{\lfloor \hat{k}_\lambda \rfloor}(-1) + \hat{\delta}_l \log_2 \tilde{M}_{\lfloor \hat{k}_\lambda \rfloor+1}(-1)$$

The prediction coefficient, $\rho$, is adjusted each frame according to the following rule:

$$\rho = \begin{cases} .4 & \text{if } L(0) \leq 15 \\ .03L(0)-.05 & \text{if } 15 < L(0) \leq 24 \\ .7 & \text{otherwise} \end{cases} \quad (12)$$

In order to form $\hat{T}_l$ using equations (9) through (12), the following assumptions are made:

$$\tilde{M}_0(-1)=1.0 \quad (13)$$

$$\tilde{M}_l(-1)=\tilde{M}_{\tilde{L}(-1)}(-1) \text{ for } l > \tilde{L}(-1) \quad (14)$$

Also upon initialization $\tilde{M}_l(-1)$ shown be set equal to 1.0 for all l, and $\hat{L}(-1)=30$.

The $\hat{L}$ prediction residuals are then divided into 6 blocks. The length of each block, denoted $\hat{J}_i$ for $1 \leq i \leq 6$, is adjusted such that the following constraints are satisfied.

$$\sum_{i=1}^{6} \hat{J}_i = \hat{L} \tag{15}$$

$$\lfloor \frac{\hat{L}}{6} \rfloor \leq \hat{J}_i \leq \hat{J}_{i+1} \leq \lceil \frac{\hat{L}}{6} \rceil \quad \text{for } 1 \leq i \leq 5 \tag{16}$$

Figure 4:
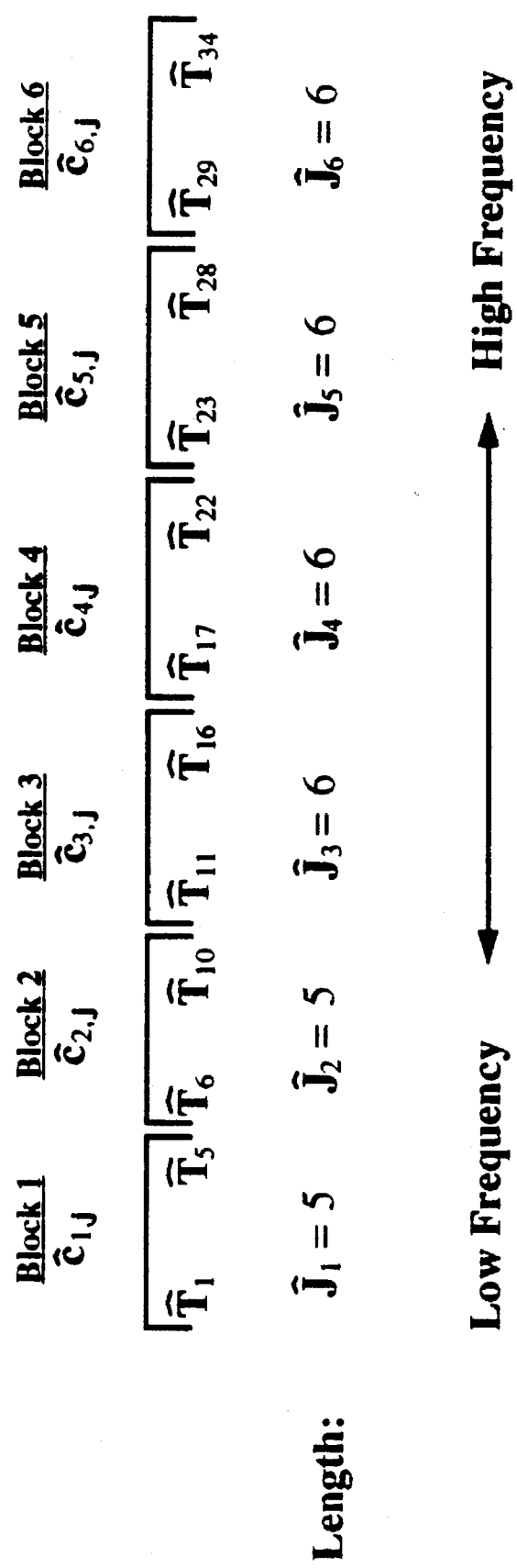
FIG. 4 shows a prefered embodiment of the invention in which the spectral amplitudes prediction residuals used in the IMBE™ speech coder are divided into six blocks for $\hat{L}=34$.

The first or lowest frequency block is denoted by $\hat{c}_{1,j}$ for $1 \leq j \leq \hat{J}_1$, and it consists of the first $\hat{J}_1$ consecutive elements of $\tilde{T}_l$ (i.e. $1 \leq l \leq \hat{J}_1$). The second block is denoted by $\hat{c}_{2,j}$ for $1 \leq j \leq \hat{J}_2$, and it consists of the next $\hat{J}_2$ consecutive elements of $\tilde{T}_l$ (i.e. $\hat{J}_1+1 \leq l \leq \hat{J}_1+\hat{J}_2$). This continues through the sixth or highest frequency block, which is denoted by $\hat{c}_{6,j}$ for $1 \leq j \leq \hat{J}_6$. It consists of the last $\hat{J}_6$ consecutive elements of $\tilde{T}_l$ (i.e. $\hat{L}+1-\hat{J}_6 \leq l \leq \hat{L}$). An example of this process is shown in FIG. 4 for $\hat{L}=34$.

Each of the six blocks is transformed using a Discrete Cosine Transform (DCT). The length of the DCT for the i'th block is equal to $\hat{J}_i$. The DCT coefficients are denoted by $\hat{C}_{i,k}$, where $1 \leq i \leq 6$ refers to the block number, and $1 \leq k \leq \hat{J}_i$ refers to the particular coefficient within each block. The formula for the computation of these DCT coefficients is as follows:

$$\hat{C}_{i,k} = \frac{1}{\hat{J}_i} \sum_{j=1}^{\hat{J}_i} \hat{c}_{i,j} \cos\left[ \frac{\pi(k-1)(j-1/2)}{\hat{J}_i} \right] \tag{17}$$

for $1 \leq k \leq \hat{J}_i$

Figure 5:
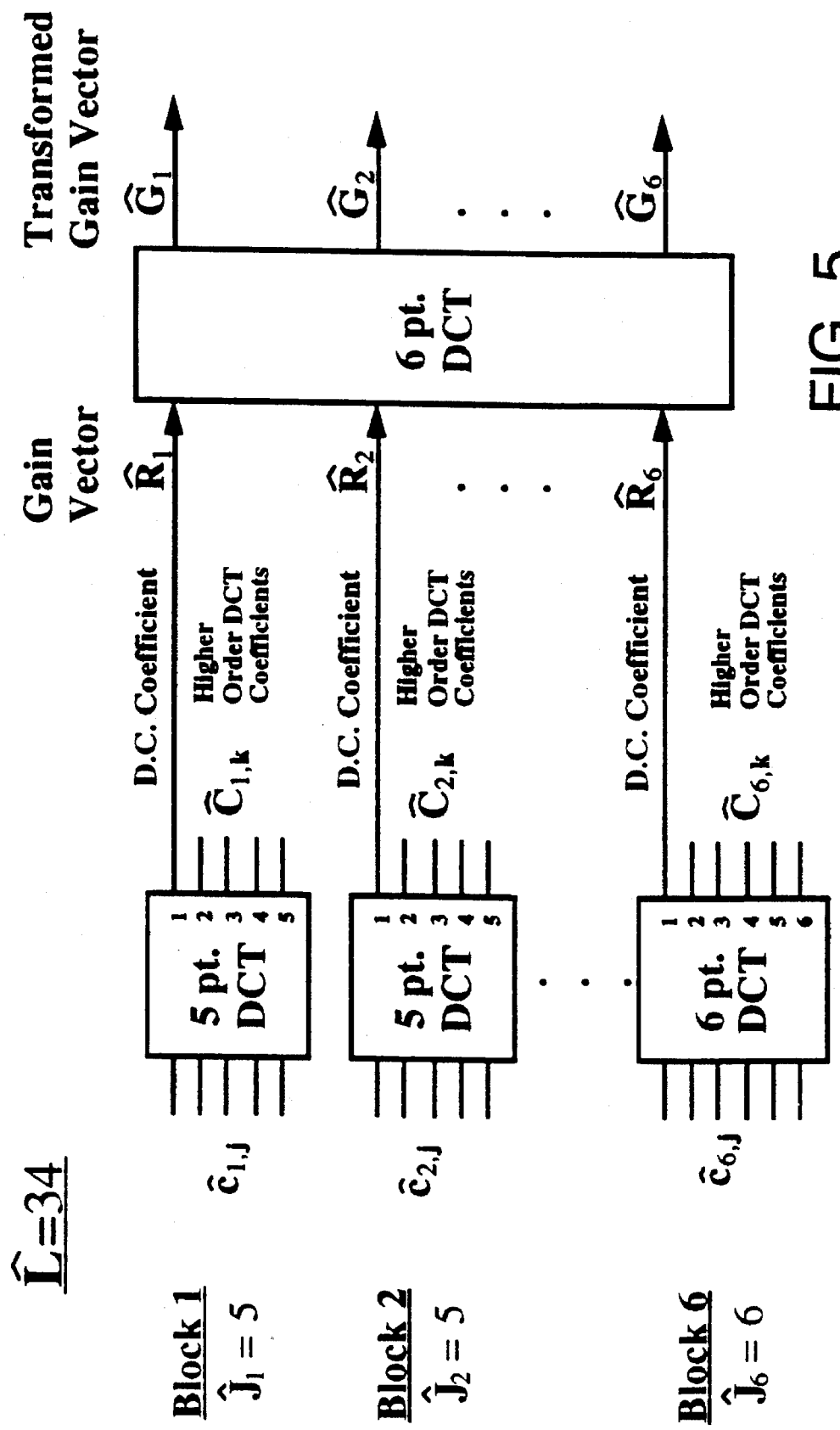
FIG. 5 is a block diagram showing a prefered embodiment of the invention in which the gain vector, used in part to represent the IMBE™ spectral amplitudes, is formed.

The DCT coefficients from each of the six blocks are then divided into two groups. The first group consists of the first DCT coefficient from each of the six blocks. These coefficients are used to form a six element vector, $\hat{R}_i$ for $1 \leq i \leq 6$, where $\hat{R}_i = \hat{C}_{i,1}$. The vector $\hat{R}_i$ is referred to as the gain vector, and its construction is shown in FIG. 5.

The second group consists of the remaining higher order DCT coefficients. These coefficients correspond to $\hat{C}_{i,j}$, where $1 \leq i \leq 6$ and $2 \leq j \leq \hat{J}_i$. Note that is $\hat{J}_i=1$, then there are no higher order DCT coefficients in the i'th block.

One important feature of the spectral amplitude encoding method, is that the spectral amplitude information is transmitted differentially. Specifically, a prediction residual is transmitted which measures the change in the spectral envelope between the current frame and the previous frame. In order for a differential scheme of this type to work properly, the encoder must simulate the operation of the decoder and use the reconstructed spectral amplitudes from the previous frame to predict the spectral amplitudes of the current frame. The IMBE™ spectral amplitude encoder simulates the spectral amplitude decoder by setting $\tilde{L}=\hat{L}$ and then reconstructing the spectral amplitudes as discussed above. This is shown as the feedback path in FIG. 3.

The gain vector can be viewed as a coarse representation of the spectral envelope of the current segment of speech. The quantization of the gain vector begins with a six point DCT of $\hat{R}_i$ for $1 \leq i \leq 6$ as shown in the following equation.

$$\hat{G}_m = \frac{1}{6} \sum_{i=1}^{6} \hat{R}_i \cos\left[ \frac{\pi(m-1)(i-1/2)}{6} \right] \tag{18}$$

for $1 \leq m \leq 6$

The resulting vector, denoted by $\hat{G}_m$ for $1 \leq m \leq 6$, is quantized in two parts. The first element, $\hat{G}_1$, can be viewed as representing the overall gain or level of the speech segment. This element is quantized using the 6 bit non-uniform quantizer given in Appendix E of the APCO/NASTD/Fed Project 25 Vocoder Description, incorporated herein by reference. The 6 bit value $\hat{b}_2$ is defined as the index of the quantizer value (as shown in this Appendix) which is closest, in a mean-square error sense, to $\hat{G}_1$. The remaining five elements of $\hat{G}_m$ are quantized using uniform scalar quantizers where the five quantizer values $\hat{b}_3$ to $\hat{b}_7$ are computed from the vector elements as shown in Equation (19).

$$\hat{b}_m = \begin{cases} 0 & \text{if } \lfloor \frac{\hat{G}_{m-1}}{\hat{\Delta}_m} \rfloor < -2^{\hat{B}_m-1} \\ 2^{\hat{B}_m}-1 & \text{if } \lfloor \frac{\hat{G}_{m-1}}{\hat{\Delta}_m} \rfloor \geq 2^{\hat{B}_m-1} \\ \lfloor \frac{\hat{G}_{m-1}}{\hat{\Delta}_m} \rfloor + 2^{\hat{B}_m-1} & \text{otherwise} \end{cases} \tag{19}$$

for $3 \leq m \leq 7$

The parameters $\hat{B}_m$ and $\hat{\Delta}_m$ in Equation (19) are the number of bits and the step sizes used to quantize each element. These values are dependent upon $\hat{L}$, which is the number of harmonics in the current frame. This dependence is tabulated in Appendix F of the APCO/NASTD/Fed Project 25 Vocoder Description, incorporated herein by reference. Since $\hat{L}$ is known by the encoder, the correct values of $\hat{B}_m$ and $\hat{\Delta}_m$ are first obtained using this Appendix and then the quantizer values $\hat{b}_m$ for $3 \leq m \leq 7$ are computed using Equation (19). The final step is to convert each quantizer value into an unsigned binary representation using the same method as shown in Table 2.

Once the gain vector has been quantized, the remaining bits are used to encode the $\hat{L}-6$ higher order DCT coefficients which complete the representation of the spectral amplitudes. Appendix G of the APCO/NASTD/Fed Project 25 Vocoder Description, incorporated herein by reference, shows the bit allocation as a function of $\hat{L}$ for these coefficients. For each value of $\hat{L}$ the $\hat{L}-6$ entries, labeled $\hat{b}_8$ through $\hat{b}_{\hat{L}}+1$, provide the bit allocation for the higher order DCT coefficients. The adopted convention is that $[\hat{b}_4, \hat{b}_5, \ldots, \hat{b}_{\hat{L}}+1]$

TABLE 3

Uniform Quantizer Step Size for Higher Order DCT Coefficients

| Number of Bits | Step Size |
| --- | --- |
| 1 | $1.2\sigma$ |
| 2 | $.85\sigma$ |
| 3 | $.65\sigma$ |
| 4 | $.40\sigma$ |
| 5 | $.28\sigma$ |
| 6 | $.15\sigma$ |
| 7 | $.08\sigma$ |
| 8 | $.04\sigma$ |
| 9 | $.02\sigma$ |
| 10 | $.01\sigma$ | correspond to $[\hat{C}_{1,2}, \hat{C}_{1,3}, \ldots, \hat{C}_{1,\hat{J}_1}, \ldots, \hat{C}_{6,2}, \hat{C}_{6,3}, \ldots, \hat{C}_{6,\hat{J}_6}]$, respectively.

Once the bit allocation for the higher order DCT coefficients has been obtained, these coefficients are quantized using uniform quantization. The step size used to quantize each coefficient must be computed the bit allocation and the standard deviation of the DCT coefficient using Tables 3 and 4. For example, if 4 bits are allocated for a particular coefficient, then from Table 3 the step size, $\hat{\Delta}$, equals, $0.40\sigma$. If this was the third DCT coefficient from any block (i.e., $\hat{C}_{i,3}$), then $\sigma=0.241$ as shown in Table 4. Performing this multiplication gives a step size of 0.0964. Once the bit allocation and the step sizes for the higher order DCT coefficients have been determined, then the quantizer values $\hat{b}_m$ for $8 \leq m \leq \hat{L}+1$ are computed according to Equation (20).

$$\hat{b}_m = \begin{cases} 0 & \text{if } \lfloor \frac{\hat{C}_{i,k}}{\hat{\Delta}_m} \rfloor < -2^{\hat{B}_m-1} \\ 2^{\hat{B}_m}-1 & \text{if } \lfloor \frac{\hat{C}_{i,k}}{\hat{\Delta}_m} \rfloor \geq 2^{\hat{B}_m-1} \\ \lfloor \frac{\hat{C}_{i,k}}{\hat{\Delta}_m} \rfloor + 2^{\hat{B}_m-1} & \text{otherwise} \end{cases} \quad (20)$$

for $8 \leq m \leq \hat{L}+1$

The parameters $\hat{b}_m$, $\hat{B}_m$ and $\hat{\Delta}_m$ in equation (20) refer to the quantizer value, the number

TABLE 4

Standard Deviation of Higher Order DCT Coefficients

| DCT Coefficient | σ |
|---|---|
| $C_{i,2}$ | .307 |
| $C_{i,3}$ | .241 |
| $C_{i,4}$ | .207 |
| $C_{i,5}$ | .190 |
| $C_{i,6}$ | .190 |
| $C_{i,7}$ | .179 |
| $C_{i,8}$ | .173 |
| $C_{i,9}$ | .165 |
| $C_{i,10}$ | .170 | of bits and the step size which has been computed for $\hat{C}_{i,k}$, respectively. Note that the relationship between m, i, and k in Equation (20) is known and can be expressed as:

$$m = 6 + k + \sum_{n=1}^{i-1} \hat{J}_n \quad (21)$$

Finally, each quantizer value is converted into the appropriate unsigned binary representation which is analogous to that shown in Table 2.

Figure 6:
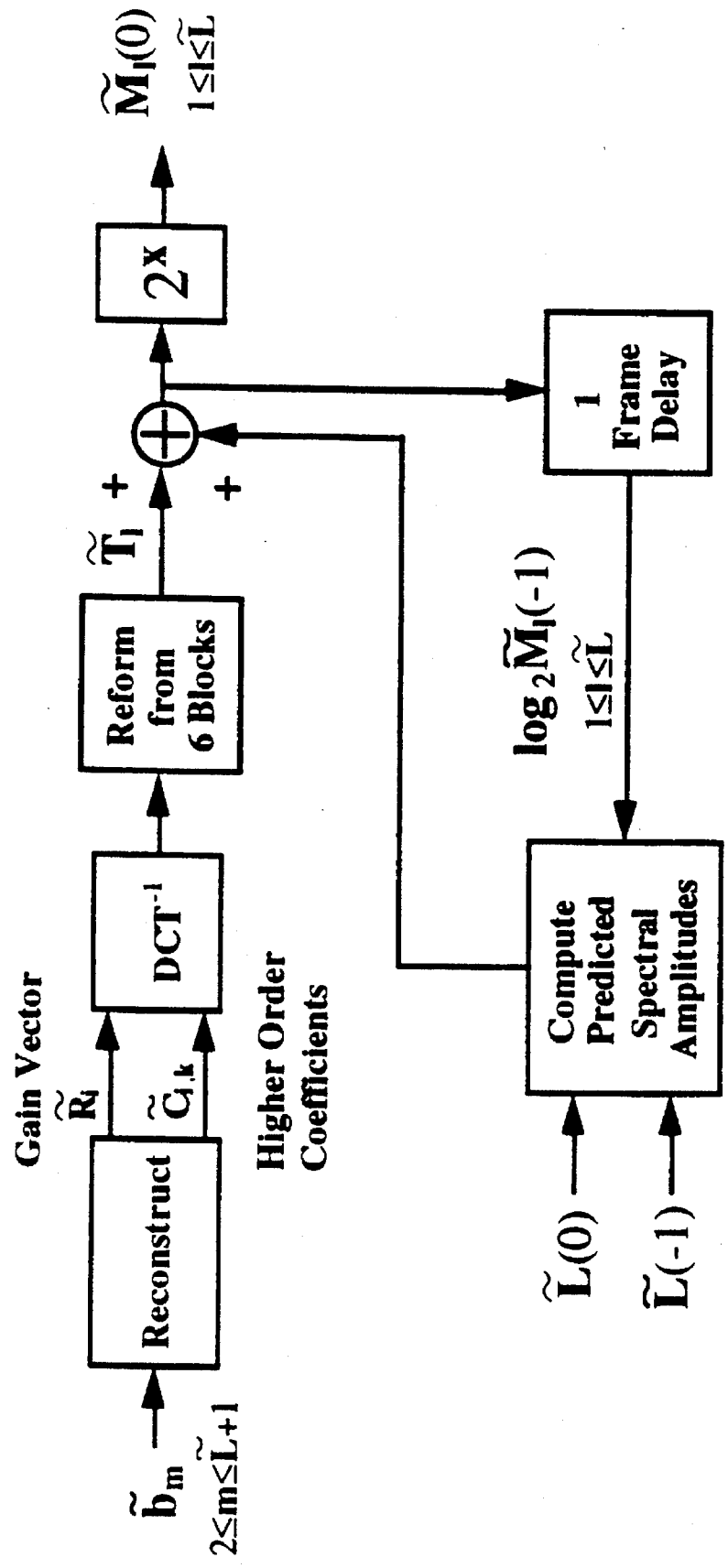
FIG. 6 is a block diagram showing a prefered embodiment of the invention in which the spectral amplitudes used in the IMBE™ speech coder are reconstructed (i.e. inverse quantized) from a set of quantizer values, denoted $\hat{b}_2$ through $\hat{b}_{\hat{L}}+1$.

In order for the decoder to reconstruct the spectral amplitudes the parameter $\tilde{L}$ must first be computed from $\tilde{b}_0$ using Equations (3) and (4). Then the spectral amplitudes can be decoded and reconstructed by inverting the quantization and encoding procedure described above. A block diagram of the spectral amplitude decoder is shown in FIG. 6.

The first step in the spectral amplitude reconstruction process is to divide the spectral amplitudes into six blocks. The length of each block, $\tilde{J}_i$ for $1 \leq i \leq 6$, is adjusted to meet the following constraints.

$$\sum_{i=1}^{6} \tilde{J}_i = \tilde{L} \quad (22)$$

$$\lfloor \frac{\tilde{L}}{6} \rfloor \leq \tilde{J}_i \leq \tilde{J}_{i+1} \leq \lceil \frac{\tilde{L}}{6} \rceil \quad \text{for } 1 \leq i \leq 5 \quad (23)$$

The elements of these blocks are denoted by $\tilde{C}_{i,k}$, where $1 \leq i \leq 6$ denotes the block number and where $1 \leq k \leq \tilde{J}_i$ denotes the element within the block. The first element of each block is then set equal to the decoded gain vector $\tilde{R}_i$ via equation (24).

$$\tilde{C}_{i,1} = \tilde{R}_i \text{ for } 1 \leq i \leq 6 \quad (24)$$

The remaining elements of each block correspond to the decoded higher order DCT coefficients.

The gain is decoded in two parts. First the six bit quantizer value $\tilde{b}_2$ is used to reconstruct the first element of the transformed gain vector, denoted by $\tilde{G}_1$. This is done by using the 6 bit value $\tilde{b}_2$ as an index into the quantizer values listed in Appendix E of the APCO/NASTD/Fed Project 25 Vocoder Description, incorporated herein by reference. Next the five quantizer values $\tilde{b}_3$ through $\tilde{b}_7$ are used to reconstruct the remaining five elements of the transformed gain vector, denoted by $\tilde{G}_2$ through $\tilde{G}_6$. This is done by using $\tilde{L}$, the number of harmonics in the current frame, in combination with the table in this Appendix to establish the bit allocation and step size for each of these five elements. The relationship between the received quantizer values and the transformed gain vector elements is expressed in Equations (25), $$\tilde{G}_{m-1} = \begin{cases} 0 & \text{if } \tilde{B}_m = 0 \\ \tilde{\Delta}_m(\tilde{b}_m - 2^{\tilde{B}_m-1} + .5) & \text{otherwise} \end{cases} \quad (25)$$

for $3 \leq m \leq 7$ where $\tilde{\Delta}_m$ and $\tilde{B}_m$ are the step sizes and the number of bits found via Appendix F of the APCO/NASTD/Fed Project 25 Vocoder Description, incorporated herein by reference. Once the transformed gain vector has been reconstructed in this manner, the gain vector $\tilde{R}_i$ for $1 \leq i \leq 6$ must be computed through an inverse DCT of $\tilde{G}_m$ as shown in the following equations.

$$\tilde{R}_i = \sum_{m=1}^{6} \alpha(m) \tilde{G}_m \cos\left[\frac{\pi(m-1)\left(i-\frac{1}{2}\right)}{6}\right] \quad (26)$$

for $1 \leq m \leq 6$ $$\alpha(m) = \begin{cases} 1 & \text{if } m = 1 \\ 2 & \text{otherwise} \end{cases} \quad (27)$$

The higher order DCT coefficients, which are denoted by $\tilde{C}_{i,k}$ for $2 \leq i \leq 6$ and $1 \leq k \leq \tilde{J}_i$, are reconstructed from the quantizer values $\tilde{b}_8, \tilde{b}_9, \ldots, \tilde{b}_{\tilde{L}+1}$. First the bit allocation table listed in Appendix G of the APCO/NASTD/Fed Project 25 Vocoder Description, incorporated herein by reference, is used to determine the appropriate bit allocation. The adopted convention is that $[\tilde{b}_8, \tilde{b}_9, \ldots, \tilde{b}_{\tilde{L}+1}]$ correspond to $[\tilde{C}_{1,2}, \tilde{C}_{1,3}, \ldots, \tilde{C}_{1,\tilde{J}_1}, \ldots, \tilde{C}_{6,2}, \tilde{C}_{6,3}, \ldots, \tilde{C}_{6,\tilde{J}_6}]$, respectively. Once the bit allocation has been determined the step sizes for each $\tilde{C}_{i,k}$ are computed using Tables 3 and 4. The determination of the bit allocation and the step sizes for the decoder proceeds in the same manner as in the encoder. Using the notation $\tilde{B}_m$ and $\tilde{\Delta}_m$ to denote the number of bits and the step size, respectively, then each higher order DCT coefficient can be reconstructed according to the following formula, $$\tilde{C}_{i,k} = \begin{cases} 0 & \text{if } \tilde{B}_m = 0 \\ \tilde{\Delta}_m(\tilde{b}_m - 2^{\tilde{B}_m-1} + .5) & \text{otherwise} \end{cases} \quad (28)$$

for $8 \leq m \leq \tilde{L}+1$ where as in Equation (21), the following equation can be used to relate m, i, and k.

$$m = 6 + k + \sum_{n=1}^{i-1} \tilde{J}_n \quad (29)$$

Once the DCT coefficients $\tilde{C}_{i,k}$ have been reconstructed, an inverse DCT is computed on each of the six blocks to form the vectors $\tilde{c}_{i,j}$. This is done using the following equations for $1 \leq i \leq 6$.

$$\tilde{c}_{i,j} = \sum_{k=1}^{\tilde{J}_i} \alpha(k)\hat{C}_{i,k} \cos\left[\frac{\pi(k-1)\left(j-\frac{1}{2}\right)}{\tilde{J}_i}\right] \quad (30)$$

for $1 \leq j \leq \tilde{J}_i$ $$\alpha(k) = \begin{cases} 1 & \text{if } k=1 \\ 2 & \text{otherwise} \end{cases} \quad (31)$$

The six transformed blocks $\tilde{c}_{i,j}$ are then joined to form a single vector of length $\tilde{L}$, which is denoted $\tilde{T}_l$ for $1 \leq l \leq \tilde{L}$. The vector $\tilde{T}_l$ corresponds to the reconstructed spectral amplitude prediction residuals. The adopted convention is that the first $\tilde{J}_1$ elements of $\tilde{T}_l$ are equal to $\tilde{c}_{1,j}$ for $1 \leq j \leq \tilde{J}_1$. The next $\tilde{J}_2$ elements of $\tilde{T}_l$ are equal to $\tilde{c}_{2,j}$ for $1 \leq j \leq \tilde{J}_2$. This continues until the last $\tilde{J}_6$ elements of $\tilde{T}_l$ are equal to $\tilde{c}_{6,j}$ for $1 \leq j \leq \tilde{J}_6$. Finally, the reconstructed $\log_2$ spectral amplitudes for the current frame are computed using the following equations.

$$\tilde{k}_l = \frac{\tilde{L}(-1)}{\tilde{L}(0)} \cdot l \quad (32)$$

$$\tilde{\delta}_l = \tilde{k}_l - \lfloor \tilde{k}_l \rfloor \quad (33)$$

$$\log_2 \tilde{M}_l(0) = \tilde{T}_l + \rho(1-\tilde{\delta}_l)\log_2 \tilde{M}_{\lfloor \tilde{k}_l \rfloor}(-1) + \quad (34)$$
$$\rho\tilde{\delta}_l \log_2 \tilde{M}_{\lfloor \tilde{k}_l \rfloor+1}(-1) -$$
$$\frac{\rho}{\tilde{L}(0)} \sum_{\lambda=1}^{\tilde{L}(0)} (1-\tilde{\delta}_\lambda)\log_2 \tilde{M}_{\lfloor \tilde{k}_\lambda \rfloor}(-1) +$$
$$\tilde{\delta}_\lambda \log_2 \tilde{M}_{\lfloor \tilde{k}_\lambda \rfloor+1}(-1)$$

In order to reconstruct $\tilde{M}_l(0)$ using equations (32) through (34), the following assumptions are always made:

$$\tilde{M}_o(-1)=1.0 \quad (35)$$

$$\tilde{M}_0(-1)=\tilde{M}_{\tilde{L}(-1)}(-1) \text{ for } l > \tilde{L}(-1) \quad (36)$$

In addition it is assumed that upon initialization $\tilde{M}_l(-1)=1$ for all l, and $\tilde{L}(-1)=30$. Note that later sections of the IMBE™ decoder require the spectral amplitudes, $\tilde{M}_l$ for $1 \leq l \leq \tilde{L}$, which must be computed by applying the inverse $\log_2$ to each of the values computed with Equation (34).

One final note is that it should be clear that the IMBE™ speech coder uses a variable frame format (i.e. variable bit allocation) which is dependent upon the number of harmonics in each frame. At the encoder the value $\hat{L}$ is used to determine the bit allocation and quantizer step sizes, while at the decoder the value $\tilde{L}$ is used to determine the bit allocation and quantizer step sizes. In order to ensure proper operation it is necessary that these two values be equal (i.e. $\hat{L}=\tilde{L}$). The encoder and decoder are designed to ensure this property except in the presence of a very large number of bit errors. In addition the use of bit modulation allows the decoder to detect frames where a large number of bit errors may prevent the generation of the correct bit allocation and quantizer step sizes. In this case the decoder discards the bits for the current frame and repeats the parameters from the previous frame. This is discussed in more detail in latter sections of this document.

A final one bit quantizer value is reserved in each speech frame for synchronization. This quantizer value, denoted by $\hat{b}_{L+2}$ is set to an alternating sequence by the encoder. If this bit was set to 0 during the previous speech frame, then this bit should be set to a 1 for the current speech frame. Otherwise, if this bit was set to 1 during the previous speech frame, then this bit should be set to a 0 for the current speech frame. This is expressed in the following equation, where $\hat{b}_{L+2}(0)$ refers to the value for the current frame, while $\hat{b}_L+2(-1)$ refers to the value for the previous frame.

$$\hat{b}_{L+2}(0) = \begin{cases} 0 & \text{if } \hat{b}_{L+2}(-1) = 1 \\ 1 & \text{otherwise} \end{cases} \quad (37)$$

It is assumed that $\hat{b}_{L}+2(0)$ should be set equal to 0 during the first frame following initialization.

The decoder may use this bit to establish synchronization. As presented later in this description, this bit is not error control encoded or modulated, and it is placed in a fixed offset relative to the beginning of each 144 bit frame of speech data. The decoder may check each possible offset in the received data stream and establish which offset is most likely to correspond to the synchronization bit. The beginning of each speech frame can then be established using the known distance between the beginning of each speech frame and the synchronization bit. Note that the number of received speech frames which is used to establish synchronization can be modified to trade off the probability of false synchronization, the synchronization delay, and the ability to acquire synchronization in the presence of bit errors. Also note that other synchronization fields may be provided outside the IMBE™ speech coder which may eliminate the need to use $\hat{b}_L+2$ for synchronization.

The IMBE™ encoder combines the quantization methods described above with a sequence of bit manipulations to increase the systems robustness to channel degradations (i.e. bit errors). Each frame of quantizer values, denoted by $\hat{b}_0, \ldots, \hat{b}_L+2$, is first prioritized into a set of bit vectors, denoted by $\hat{u}_0, \ldots, \hat{u}_7$ according to each bits sensitivity to bit errors. The results is that bit errors introduced into the highest priority bit vector, $\hat{u}_0$, cause large distortions in the decoded speech. Conversely, bit errors added to the lowest priority bit vector, $\hat{u}_7$, cause small distortions in the decoded speech. The bit vectors are then protected with error control codes, including both [23,12] Golay codes and [15,11] Hamming codes, to produce a set of code vectors denoted by $\hat{v}_0, \ldots, \hat{v}_7$. The use of bit prioritization increases the effectiveness of the error control codes, since only the most sensitive bits are protected by the high redundancy Golay codes.

Figure 7:
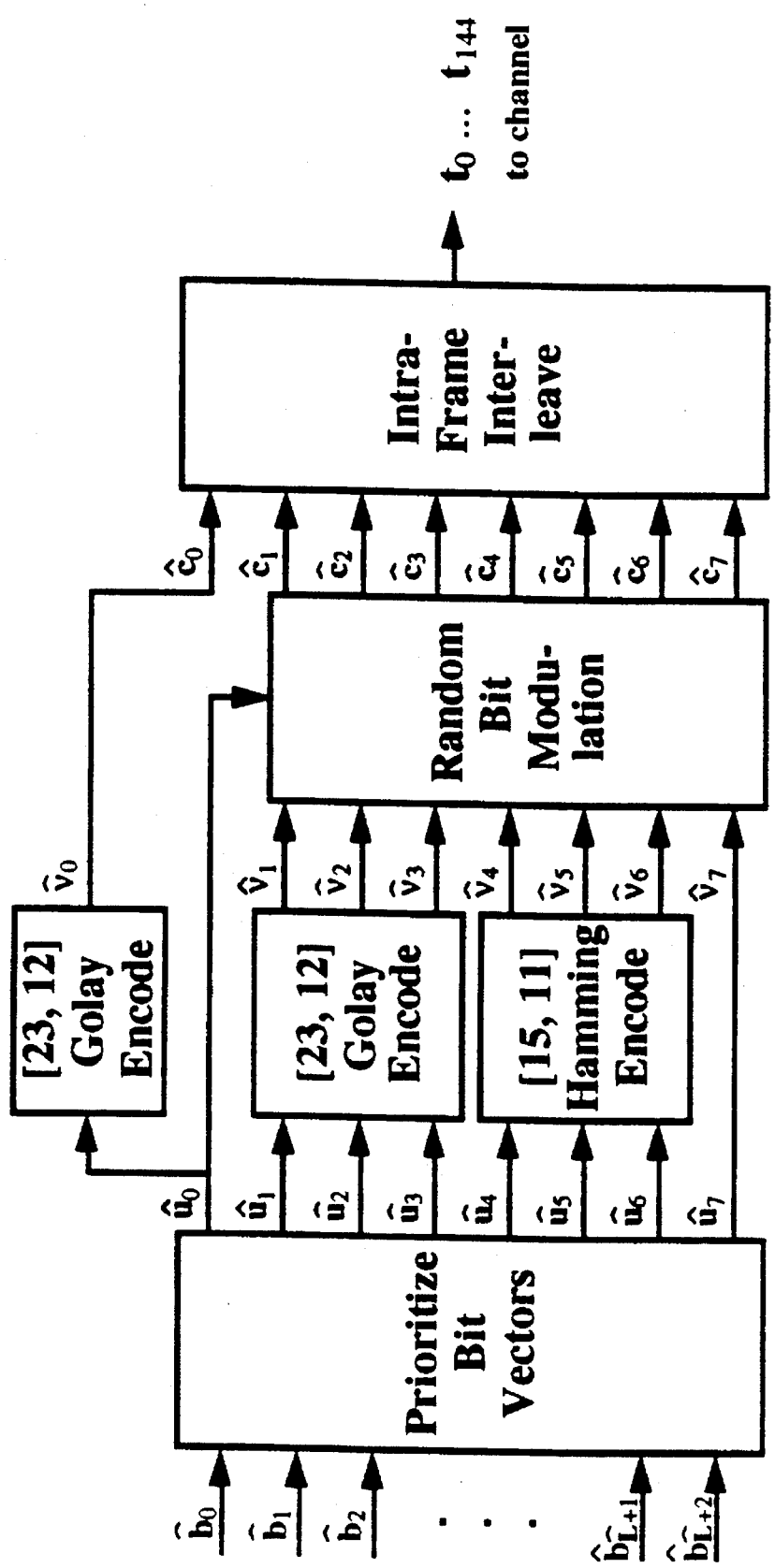
FIG. 7 is a block diagram showing a prefered embodiment of the invention in which the quantizer values for a frame of IMBE™ model parameters are encoded into a frame of digital data.

The IMBE™ encoder also utilizes bit modulation to further increase the systems robustness to bit errors. One of the bit vectors is used to generate a modulation key which is used to initialize a pseudo-random sequence. This sequence is converted into a set of binary modulation vectors which are added modulo 2 to the code vectors (i.e. after error control encoding). The result is a set of modulated code vectors denoted by $\hat{c}_0, \ldots, \hat{c}_7$. Finally, intra-frame bit interleaving is used on the modulated code vectors in order to spread the effect of short burst errors. A block diagram of the bit manipulations performed by the encoder is shown in FIG. 7.

Figure 8:
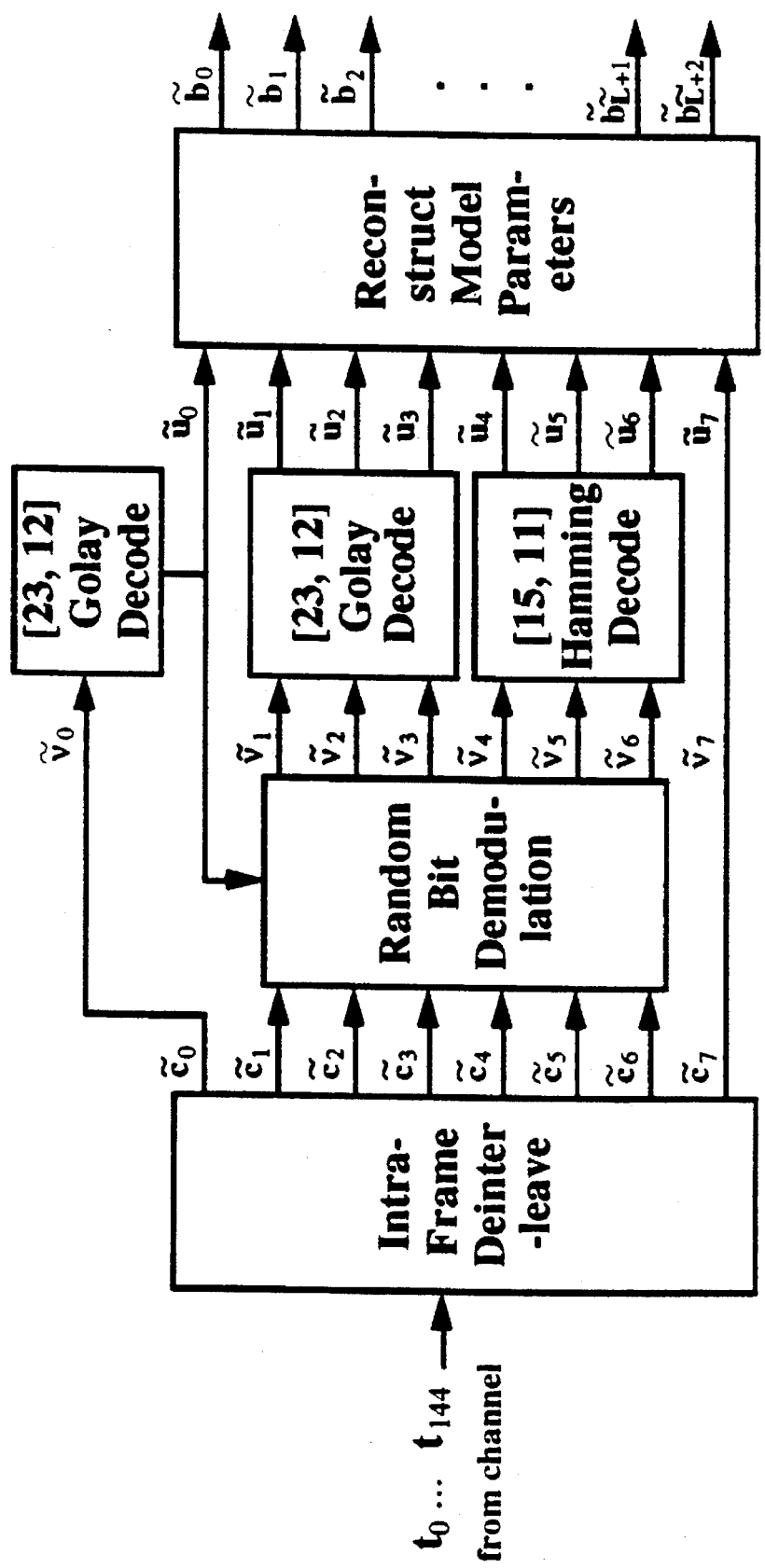
FIG. 8 is a block diagram showing a prefered embodiment of the invention in which a frame of digital data is decoded into a set of quantizer values representing a frame of IMBE™ model parameters.

The IMBE™ decoder reverses the bit manipulations performed by the encoder. First the decoder de-interleaves each frame of 144 bits to obtain the eight code vectors $\tilde{c}_0, \ldots, \tilde{c}_7$. The highest priority code vector is then error control decoded and used to generate a demodulation key. The demodulation key is then used to initialize a pseudo-random sequence which is converted into a set of binary modulation vectors. These are added modulo 2 to the remaining code vectors to produce a set of demodulated code vectors, denoted by $v_0, \ldots, v_7$, which the decoder then error control decodes to reconstruct the bit vectors $\tilde{u}_0, \ldots, \tilde{u}_7$. Finally, the decoder rearranges these bit vectors to reconstruct the quantizer values, denoted by $\hat{b}_0, \hat{b}_1, \ldots, \hat{b}_{\hat{L}}+2$, which are then used to reconstruct a frame MBE model parameters. Each frame of model parameters can then be used by an IMBE™ speech synthesizer to synthesize a time segment of speech. A block diagram of the bit manipulations performed by the decoder is shown in FIG. 8.

One should note that the IMBE™ speech decoder employs a number of different mechanisms to improve performance in the presence of bit errors. These mechanisms consist first of error control codes, which are able to remove a significant number of errors. In addition, the IMBE™ speech coder uses bit modulation combined with frame repeats and frame mutes to detect and discard highly corrupted frames. Finally, the IMBE™ speech decoder uses adaptive smoothing to reduce the perceived effect of any remaining errors. These mechanisms are all discussed in the following sections of this description.

The first bit manipulation performed by the IMBE™ encoder is a prioritization of the quantizer values $\hat{b}_0, \hat{b}_1, \ldots, \hat{b}_{\hat{L}}+2$ into a set of 8 bit vectors denoted by $\hat{u}_0, \hat{u}_1, \ldots, \hat{u}_7$. The bits vectors $\hat{u}_0$ through $\hat{u}_3$ are 12 bits long, while the bit vectors $\hat{u}_4$ through $\hat{u}_6$ are 11 bits long, and the bit vector $\hat{u}_7$ is seven bits long. Throughout this section the convention has been adopted that bit N, where N is the vector length, is the most significant bit (MSB), and bit 1 is the least significant bit (LSB).

Figure 9:
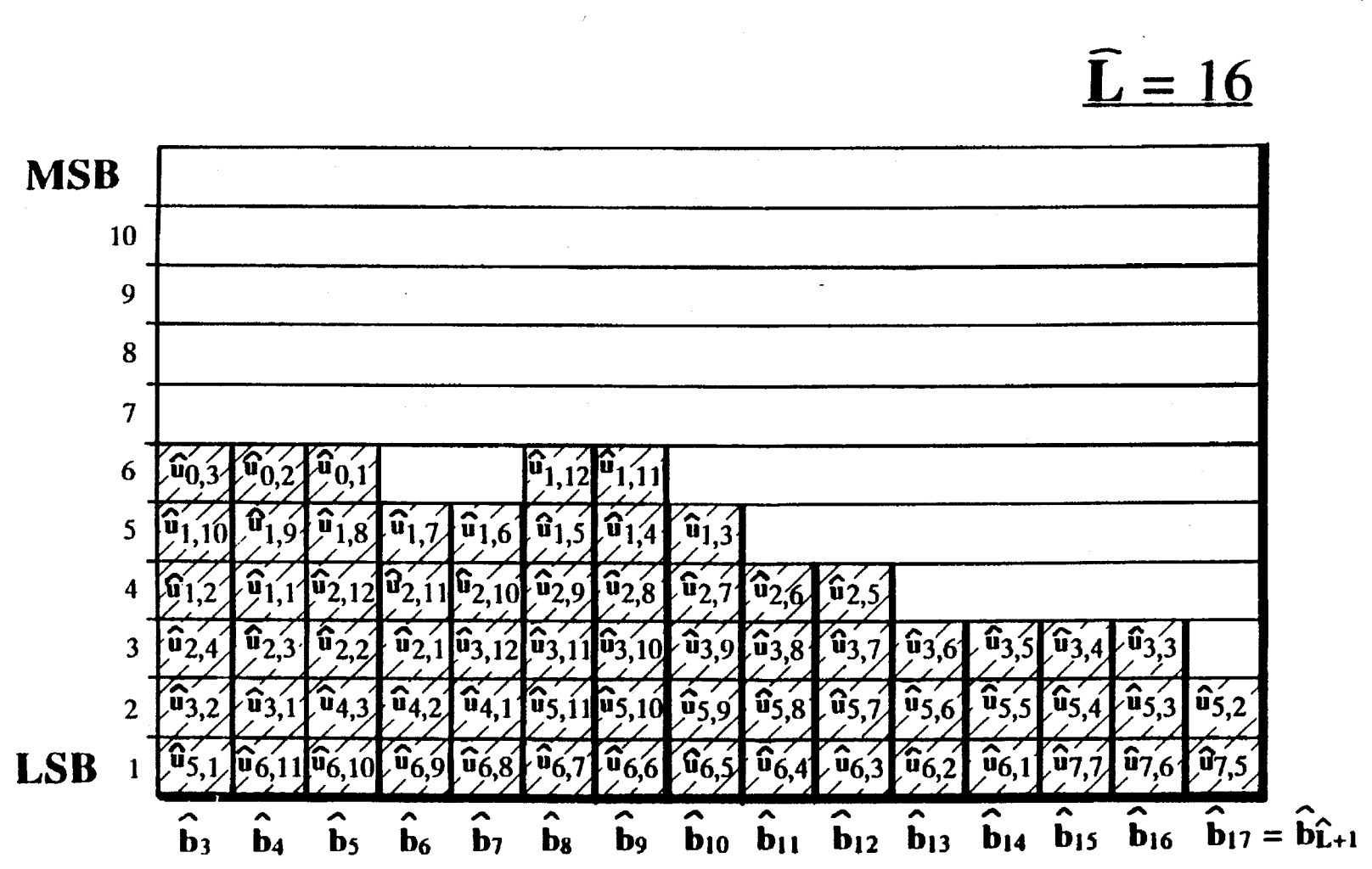

The prioritization of the quantizer values into the set of bits vectors beings with $\hat{u}_0$. The six most significant bits of $\hat{u}_0$ (i.e. bits 12 through 7) are set equal to the six most significant bits of $\hat{b}_0$ (i.e. bits 8 through 3). The next three most significant bits of $\hat{u}_0$ (i.e. bits 6 through 4) are set equal to the three most significant bits of $\hat{b}_2$ (i.e. bits 6 through 4). The remaining three bits of $\hat{u}_0$ are generated from the spectral amplitude quantizer values $\hat{b}_3$ through $\hat{b}_{\hat{L}}+1$. Specifically these quntizer values are arranged as shown in FIG. 9. In this figure the shaded areas represent the number of bits which were allocated to each of these values assuming $\hat{L}=16$. Note that for other values of $\hat{L}$ this figure would change in accordance with the bit allocation information contained in Appendices F and G of the APCO/NASTD/Fed Project 25 Vocoder Description, incorporated herein by reference. The remaining three bits of $\hat{u}_0$ are then selected by beginning in the upper left hand corner of this figure (i.e. 10 of $\hat{b}_3$) and scanning left to right. When the end of any row is reached the scanning proceeds from left to right on the next lower row. Bit 3 of $\hat{u}_0$ is set equal to the bit corresponding to the first shaded block which is encountered using the prescribed scanning order. Similarly, bit 2 of $\hat{u}_0$ is set equal to the bit corresponding to the second shaded block which is encountered and bit 1 of $\hat{u}_0$ is set equal to the bit corresponding to the third shaded block which is encountered.

Figure 10:
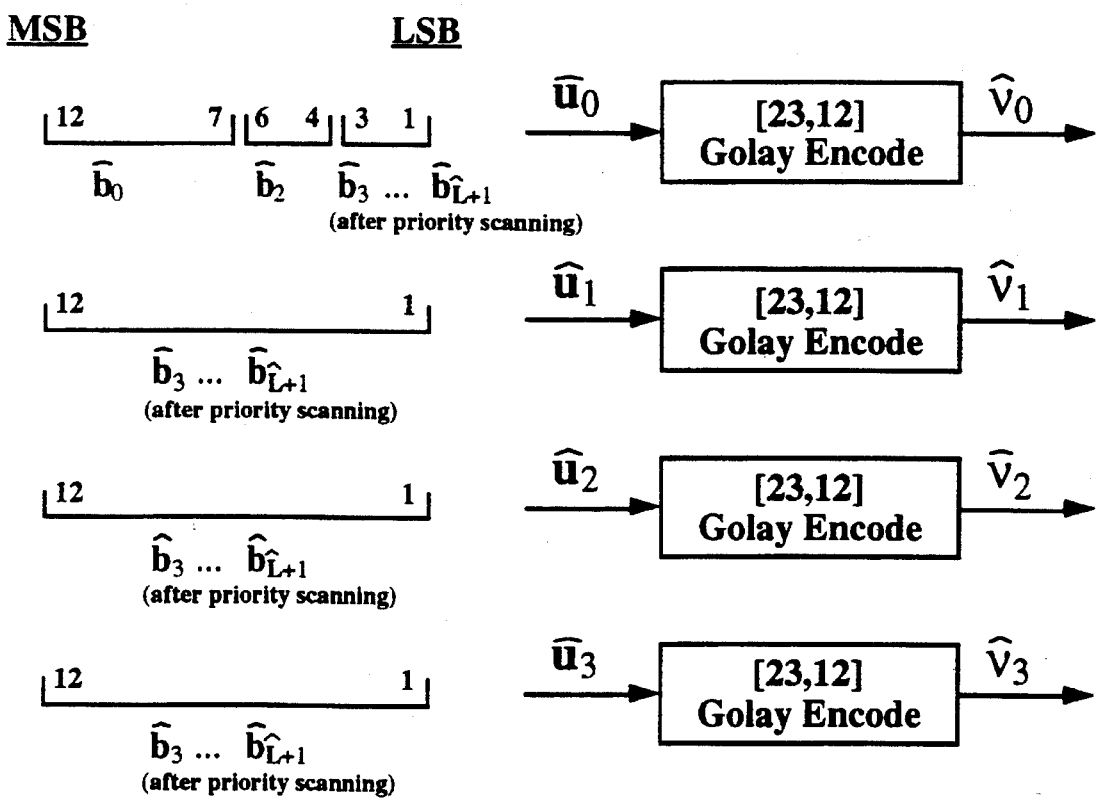
FIG. 10 is a block diagram showing a prefered embodiment of the invention in which the four highest priority code vectors are formed from the quantizer values used in the 7.2 kbps IMBE™ speech coder.

The scanning of the spectral amplitude quantizer values $\hat{b}_3$ through $\hat{b}_{\hat{L}}+1$ which is used to generate the last three bits of $\hat{u}_0$ is continued for the bit vectors $\hat{u}_1$ through $\hat{u}_3$. Each successive bit in these vectors is set equal to the bit corresponding to the next shaped block. This process begins with bit 12 of $\hat{u}_1$, proceeds through bit 1 of $\hat{u}_1$ followed by bit 12 of $\hat{u}_2$, and continues in this manner until finally reaching bit 1 of $\hat{u}_3$. At this point the 48 highest priority (i.e. most sensitive) bits have been assigned to the bit vectors $\hat{u}_0$ through $\hat{u}_3$ as shown in FIG. 10.

Figure 11:
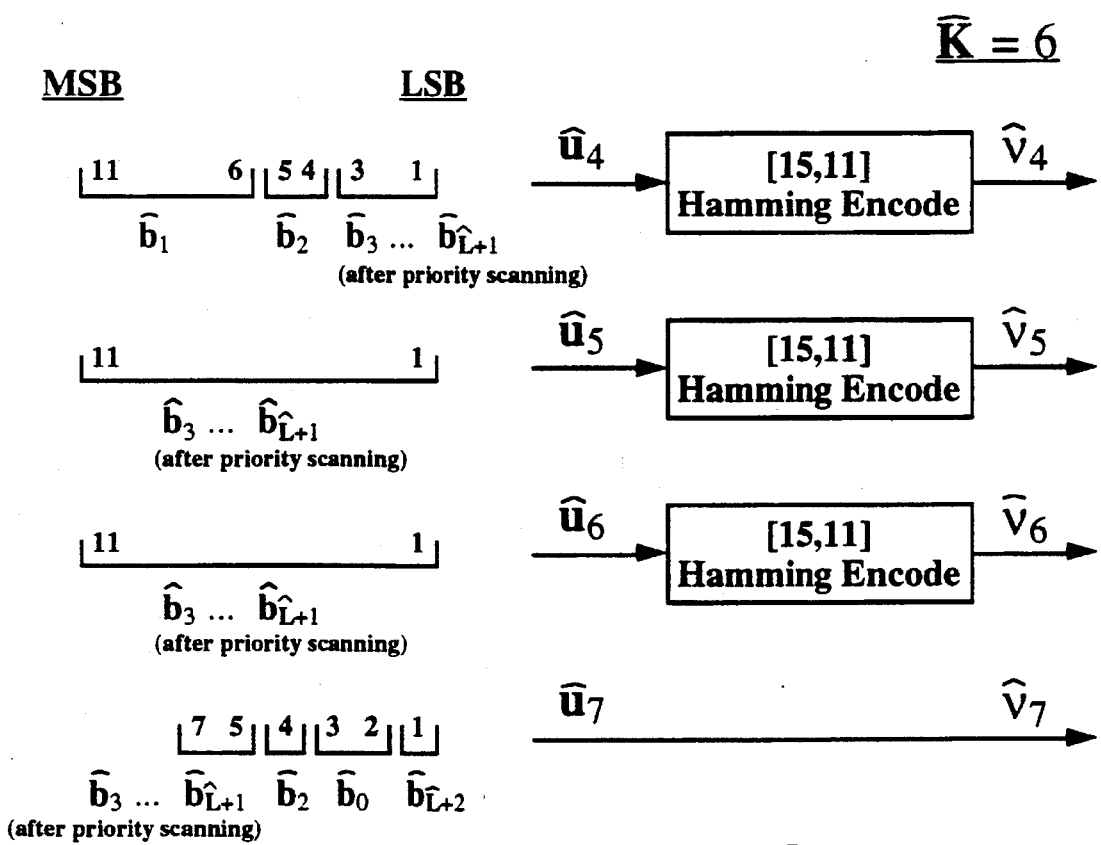
FIG. 11 is a block diagram showing a prefered embodiment of the invention in which the four lowest priority code vectors are formed from the quantizer values used in the 7.2 kbps IMBE™ speech coder.

The formation of the bit vectors $\hat{u}_4$ through $\hat{u}_7$ begins with the V/UV decision bits. This is accomplished by inserting into the bit vectors (beginning with bit 1 of $\hat{u}_4$, proceeding through bit 1 of $\hat{u}_4$ followed by bit 11 of $\hat{u}_5$, and continuing in this manner until finally reaching bit 5 of $\hat{u}_7$) all of the bits of $\hat{b}_1$ (starting with the MSB), followed by bit 3 and then bit 2 of $\hat{b}_2$, and then continuing with the scanning of $\hat{b}_3$ through $\hat{b}_{\hat{L}}+1$ as described above. The final four bits of $\hat{u}_7$ (beginning with bit 4 and ending with bit 1) are set equal to bit 1 of $\hat{b}_2$, bit 2 of $\hat{b}_0$, bit 1 of $\hat{b}_0$, and then bit 1 of $\hat{b}_{\hat{L}}+2$, respectively. A block diagram of this procedure is shown in FIG. 11 for $\hat{K}=6$.

The formation of the bit vectors described above prioritizes the bits according to their sensitivity to bit errors. A bit error introduced into $\hat{u}_0$ generally causes the largest degradation in speech quality, while a bit error introduced into $\hat{u}_7$ generally causes little degradation in speech quality. Consequently the 56 bits per frame available for error control are used to protect the first four bit vectors with [23,12] Golay codes, while the next three bit vectors are protected with [15,11] Hamming codes. The last bit vector is left unprotected. This approach is efficient, since it only uses the more redundant (and hence more robust) Golay codes where they are most needed, while using less redundant (and hence less robust) codes in other areas.

The bit prioritization described above can be viewed as assigning a weight to each allocated bit location in the set of quantizer values. Within any one quantizer value the weight is greater for a more significant bit location than for a less significant bit location. In addition the relative weight of a bit location of the same significance in different quantizer values is dependent upon each quantizer values sensitivity to bit errors (i.e. the perceived degradation that results after speech is synthesized with bit errors in a particular quantizer value). Once weight have been assigned to each bit location, then the contruction of the bit vectors is performed by ordering each bit according to the weight of its bit location and then partitioning the ordered bit sequence into bit vectors of the appropriate length.

Once the eight bit vectors have been formed, they are each converted into a corresponding code vector. The generation of the eight code vectors $\hat{v}_i$ for $0 \leq i \leq 7$ is performed according to the following set of equations, $$\hat{v}_i = \hat{u}_i \cdot P_G \text{ for } 0 \leq i \leq 3 \tag{38}$$

$$\hat{v}_i = \hat{u}_i \cdot P_H \text{ for } 4 \leq i \leq 6 \tag{39}$$

$$\hat{v}_7 = \hat{u}_7 \tag{40}$$

where the $P_G$ and $P_H$ are the parity matrices for the [23,12] Golay code and the [15,11] Hamming code, respectively. These are shown below where absent entries are assumed to equal zero. Note that all operations are modulo 2 as defined in the reference incorporated herein, and the vectors $\hat{v}_i$ and $\hat{u}_i$ are assumed to be row vectors, where the "left" most bit is the MSB. This convention is used throughout this section.

$$P_G = \begin{bmatrix} 1 & 0 & & & & & & & & & & & 1 & 1 & 0 & 0 & 0 & 1 & 1 & 1 & 0 & 1 & 0 \\ 0 & 1 & 0 & & & & & & & & & & 0 & 1 & 1 & 0 & 0 & 0 & 1 & 1 & 1 & 0 & 1 \\ & 0 & 1 & 0 & & & & & & & & & 1 & 1 & 1 & 1 & 0 & 1 & 1 & 0 & 1 & 0 & 0 \\ & & 0 & 1 & 0 & & & & & & & & 0 & 1 & 1 & 1 & 1 & 0 & 1 & 1 & 0 & 1 & 0 \\ & & & 0 & 1 & 0 & & & & & & & 0 & 0 & 1 & 1 & 1 & 1 & 0 & 1 & 1 & 0 & 1 \\ & & & & 0 & 1 & 0 & & & & & & 1 & 1 & 0 & 1 & 1 & 0 & 0 & 1 & 1 & 0 & 0 \\ & & & & & 0 & 1 & 0 & & & & & 0 & 1 & 1 & 0 & 1 & 1 & 0 & 0 & 1 & 1 & 0 \\ & & & & & & 0 & 1 & 0 & & & & 0 & 0 & 1 & 1 & 0 & 1 & 1 & 0 & 0 & 1 & 1 \\ & & & & & & & 0 & 1 & 0 & & & 1 & 1 & 0 & 1 & 1 & 1 & 0 & 0 & 0 & 1 & 1 \\ & & & & & & & & 0 & 1 & 0 & & 1 & 0 & 1 & 0 & 1 & 0 & 0 & 1 & 0 & 1 & 1 \\ & & & & & & & & & 0 & 1 & 0 & 1 & 0 & 0 & 1 & 0 & 0 & 1 & 1 & 1 & 1 & 1 \\ & & & & & & & & & & 0 & 1 & 1 & 0 & 0 & 0 & 1 & 1 & 1 & 0 & 1 & 0 & 1 \end{bmatrix}$$

$$P_H = \begin{bmatrix} 1 & 0 & & & & & & & & & 1 & 1 & 1 & 1 \\ 0 & 1 & 0 & & & & & & & & 1 & 1 & 1 & 0 \\ & 0 & 1 & 0 & & & & & & & 1 & 1 & 0 & 1 \\ & & 0 & 1 & 0 & & & & & & 1 & 1 & 0 & 0 \\ & & & 0 & 1 & 0 & & & & & 1 & 0 & 1 & 1 \\ & & & & 0 & 1 & 0 & & & & 1 & 0 & 1 & 0 \\ & & & & & 0 & 1 & 0 & & & 1 & 0 & 0 & 1 \\ & & & & & & 0 & 1 & 0 & & 0 & 1 & 1 & 1 \\ & & & & & & & 0 & 1 & 0 & 0 & 1 & 1 & 0 \\ & & & & & & & & 0 & 1 & 0 & 0 & 1 & 0 & 1 \\ & & & & & & & & & 0 & 1 & 0 & 0 & 1 & 1 \end{bmatrix}$$

The Golay parity matrix $P_G$ shown above is a systematic representation of the standard [23,12] Golay code. Standard methods of decoding this code and the Hamming code are discussed in the literature. These methods are used by the IMBE™ decoder to correct the maximum number of errors for each code.

The IMBE™ speech coder uses bit modulation to provide a mechanism for detecting error in $\hat{v}_0$ beyond the three errors that the [23,12] Golay code can correct. The first step in this procedure is to generate a set of binary modulation vectors which are added (modulo 2) to the code vectors $\hat{v}_0$ through $\hat{v}_7$. The modulation vectors are generated from a pseudo-random sequence which is initialized to the value of a modulation key which is generated from the bit vector $\hat{u}_0$. Specifically, the sequence defined in the following equation is used, $$p_r(0) = 16u_0 \qquad (41)$$

$$p_r(n) = 173 p_r(n-1) + 13849 - 65536 \left\lfloor \frac{173 p_r(n-1) + 13849}{65536} \right\rfloor \qquad (42)$$

where the bit vector $\hat{u}_0$ is interpreted as an unsigned 12 bit number in the range [0, 4095]. Equation (42) is used to recursively compute the pseudo-random sequence $p_r(n)$ over the range $1 \leq n \leq 114$. Each element of this sequence can be interpreted as a 16 bit random number which is uniformly distributed over the interval [0, 65535]. Using this interpretation, a set of binary modulation vectors, denoted by $\hat{m}_0$ through $\hat{m}_7$, are generated from this sequence as shown below.

$$\hat{m}_0 = [0, 0, \ldots, 0] \qquad (43)$$

$$\hat{m}_1 = \left[ \left\lfloor \frac{p_r(1)}{32768} \right\rfloor, \left\lfloor \frac{p_r(2)}{32768} \right\rfloor, \ldots, \left\lfloor \frac{p_r(23)}{32768} \right\rfloor \right] \qquad (44)$$

$$\hat{m}_2 = \left[ \left\lfloor \frac{p_r(24)}{32768} \right\rfloor, \left\lfloor \frac{p_r(25)}{32768} \right\rfloor, \ldots, \left\lfloor \frac{p_r(46)}{32768} \right\rfloor \right] \qquad (45)$$

$$\hat{m}_3 = \left[ \left\lfloor \frac{p_r(47)}{32768} \right\rfloor, \left\lfloor \frac{p_r(48)}{32768} \right\rfloor, \ldots, \left\lfloor \frac{p_r(69)}{32768} \right\rfloor \right] \qquad (46)$$

$$\hat{m}_4 = \left[ \left\lfloor \frac{p_r(70)}{32768} \right\rfloor, \left\lfloor \frac{p_r(71)}{32768} \right\rfloor, \ldots, \left\lfloor \frac{p_r(84)}{32768} \right\rfloor \right] \qquad (47)$$

$$\hat{m}_5 = \left[ \left\lfloor \frac{p_r(85)}{32768} \right\rfloor, \left\lfloor \frac{p_r(86)}{32768} \right\rfloor, \ldots, \left\lfloor \frac{p_r(99)}{32768} \right\rfloor \right] \qquad (48)$$

$$\hat{m}_6 = \left[ \left\lfloor \frac{p_r(100)}{32768} \right\rfloor, \left\lfloor \frac{p_r(101)}{32768} \right\rfloor, \ldots, \left\lfloor \frac{p_r(114)}{32768} \right\rfloor \right] \qquad (49)$$

$$\hat{m}_7 = [0, 0, \ldots, 0] \qquad (50)$$

Once these modulation vectors have been computed in this manner, the modulated code vectors, $\hat{v}_0$ for $0 \leq i \leq 7$, are computed by adding (modulo 2) the code vectors to the modulation vectors.

$$\hat{c}_i = \hat{v}_i + \hat{m}_i \text{ for } 0 \leq i \leq 7 \qquad (51)$$

One should note that the bit modulation performed by the IMBE™ encoder can be inverted by the decoder if $\tilde{c}_0$ does not contain any uncorrectable bit errors. In this case Golay decoding $\tilde{c}_0$, which always equals $v_0$ since $\tilde{m}_0 = 0$, will yield the correct value of $\tilde{u}_0$. The decoder can then use $\tilde{u}_0$ to reconstruct the pseudo-random sequence and the modulation vectors $\tilde{m}_1$ through $\tilde{m}_7$. Subtracting these vectors from $\tilde{c}_1$ through $\tilde{c}_7$ will then yield the code vectors $v_1$ through $v_7$. At this point the remaining error control decoding can be performed. In the other case, where $\tilde{c}_0$ contains uncorrectable bit errors, the modulation cannot generally be inverted by the decoder. In this case the likely result of Golay decoding $\tilde{c}_0$ will be some $\tilde{u}_0$. Consequently the decoder will initialize the pseudo-random sequence incorrectly, and the modulation vectors computed by the decoder will be uncorrelated with the modulation vectors used by encoder. Using the incorrect modulation vectors to reconstruct the code vectors is essentially the same as passing $v_1, \ldots, v_6$ through a 50 percent bit error rate (BER) channel. The IMBE™ decoder exploits the fact that, statistically, a 50 percent BER causes the Golay and Hamming codes employed on $v_1$ through $v_6$ to correct a number of errors which is near the maximum capability of the code. By counting the total number of errors which are corrected in all of these code vectors, the decoder is able to reliably detect frames in which $\tilde{c}_0$ is likely to contain uncorrectable bit errors. The decoder performs frame repeats during these frames in order to reduce the perceived degradation in the presence of bits errors. Experimental results have shown that frame repeats are preferable to using an incorrectly decoded $\tilde{c}_0$, since this code vector controls the bit allocation for the parameter quantizers.

Hence, the use of random bit modulation by the encoder allows the decoder to reliably detect whether there are any uncorrectable bit errors in $\tilde{c}_0$ without requiring further redundancy to be placed into the data stream. This allow efficient use of the communication channel while eliminating large degradations from being introduced into the synthesized speech.

Intra-frame bit interleaving is used to spread short bursts of errors among several code words. This decreases the probability that a short burst of errors will result in an uncorrectable error pattern. The minimum separation between any two bits of the same error correction code is 6 bits. The exact order of the 144 bits in each frame is tabulated in Appendix H of the APCO/NASTD/Fed Project 25 Vocoder Description dated 1 Dec. 1992, incorporated herein by reference. The table is this appendix uses the same notation as was discussed above, i.e. bit N (where N is the vector length) is the MSB and bit 1 is the LSB. The speech coder bits should be inserted into the Project 25 frame format beginning with the bit $\hat{t}_1$ and ending with bit $\hat{t}_{144}$.

The IMBE™ speech decoder estimates the number of errors in each received data frame by computing the number of errors corrected by each of the [23,12] and [15,11] Hamming codes. The number of errors for each code vector is denoted $\epsilon_i$ for $0 \leq i \leq 6$, where $\epsilon_i$ refers to the number of bit errors which were detected during the error control decoding of $\tilde{u}_i$. These seven bit error parameters can easily be determined by using the following equation where again all arithmetic operations are modulo 2.

$$\epsilon_i = \begin{cases} \tilde{v}_i - P_G \tilde{u}_i & \text{for } 0 \leq i \leq 3 \\ \tilde{v}_i - P_H \tilde{u}_i & \text{for } 4 \leq i \leq 6 \end{cases} \quad (52)$$

From these error values two other error parameters are computed as shown below.

$$\epsilon_T = \sum_{i=0}^{6} \epsilon_i \quad (53)$$

$$\epsilon_R(0) = .95 * \epsilon_R(-1) + .000356 \epsilon_T \quad (54)$$

The parameter $\epsilon_R(0)$ is the estimate of the error rate for the current frame, while $\epsilon_R(-1)$ is the estimate of the error rate for the previous frame. These error parameters are used to control the frame repeat process described below, and to control the adaptive smoothing functions described in below. Both of these functions are designed to improve the perceived quality of the decoded speech, given that the error control decoding is not always able to correct all of the bit errors introduced by a severely degraded channel.

The IMBE™ decoder examines each received data frame in order to detect and discard frames which are highly corrupted. A number of different fault conditions are checked and if any of these conditions indicate the current frame is invalid, then a frame repeat is performed. The IMBE™ speech encoder uses values of $\hat{b}_0$ in the range $0 \leq \hat{b}_0 \leq 207$ to represent valid pitch estimates. In addition values of $\hat{b}_0$ in the range $216 \leq \hat{b}_0 \leq 219$ are used by encoder to represent silence frames. The remaining values of $\hat{b}_0$ are reserved for future expansion (such as DTMF signals, call progress signals, enhanced speech coders, inband data, etc. . . ) and are currently considered invalid. A frame repeat is performed by the decoder if it receives an invalid value of $\hat{b}_0$, or if both of the following two equations are true.

$$\epsilon_0 \leq 2 \quad (55)$$

$$\epsilon_T \leq 11 \quad (56)$$

These two equations are used to detect the incorrect demodulations which results if there are uncorrectable bit errors in $\tilde{c}_0$. The decoder performs a frame repeat by taking the following steps:

1) The current 144 bit received data frame is marked as invalid and subsequently ignored during future processing steps.

2) The IMBE™ model parameters for the current frame are set equal to the IMBE™ model parameters for the previous frame. Specifically, the following update expressions are computed.

$$\omega_0(0) = \omega_0(-1) \quad (57)$$

$$\tilde{L}(0) = \tilde{L}(-1) \quad (58)$$

$$\tilde{K}(0) = \tilde{K}(-1) \quad (59)$$

$$v_k(0) = v_k(-1) \text{ for } 1 \leq k \leq \tilde{K} \quad (60)$$

$$\tilde{M}_l(0) = \tilde{M}_l(-1) \text{ for } 1 \leq l \leq \tilde{L} \quad (61)$$

$$\overline{M}_l(0) = \overline{M}_l(-1) \text{ for } 1 \leq l \leq \tilde{L} \quad (62)$$

3) The repeated model parameters are used in all future processing wherever the current model parameters are required (i.e. speech synthesis).

The IMBE™ decoder uses muting to squelch the output in severe bit error environments. This is indicated after four successive frames have been repeated or if $\epsilon_R > 0.085$. In addition the decoder mutes the speech output if a silence frame is received which is indicated by $216 \leq \hat{b}_0 \leq 219$. The recommended muting method is to bypass the synthesis procedure and to set the synthetic speech signal, $\tilde{s}(n)$ to random noise which is uniformly distributed over the interval $[-5, 5]$ samples.

In the embodiment described above, the logic used to detect an incorrect demodulation of the current frame is controlled by the parameters $\epsilon_i$ for $0 \leq i \leq 6$, which represent the number of errors detected during the error control decoding of $v_i$. This detection logic can be generalized to the computation of an error measure based upon the result of comparing $v_i$ with $\tilde{u}_i$ (i.e. the demodulated code vectors before and after error control decoding). If the value of this error measure exceeds a threshold then the current frame is declared invalid. This relies on the fact that incorrect demodulation causes large discrepancies between these vectors, resulting in a high value of the error measure. Some appropriate action, such as a frame repeat or a frame mute, is then performed for invalid frames. The advantage of this generalized viewpoint is that it easily accomodates alternative error measures which may offer improved performance under certain channel conditions. For example soft-decision (i.e. multi-bit) data from a modem or similar device can be combined with the disclosed demodulation method in a straight forward manner to offer improved performance.

The IMBE™ speech decoder attempts to improve the perceived quality of the synthesized speech by enhancing the spectral amplitudes. The unenhanced spectral amplitudes are required by future frames in the computation of Equation (34). However, the enhanced spectral amplitudes are used in speech synthesis. The spectral amplitude enhancement is accomplished by generating a set of spectral weights from the model parameters of the current frame. First $R_{M0}$ and $Rm_1$ are calculated as shown below $$R_{M0} = \sum_{l=1}^{\tilde{L}} \bar{M}_l^2 \tag{63}$$

$$R_{M1} = \sum_{l=1}^{\tilde{L}} \bar{M}_l^2 \cos(\tilde{\omega}_0 l) \tag{64}$$

Next, the parameters $R_{M0}$, and $R_{M1}$ are used to calculate a set of weights, $W_1$, given by $$W_l = \sqrt{\bar{M}_l} \cdot \left[ \frac{.96\pi(R_{M0}^2 + R_{M1}^2 - 2R_{M0}R_{M1}\cos(\tilde{\omega}_0 l))}{\tilde{\omega}_0 R_{M0}(R_{M0}^2 - R_{M1}^2)} \right]^{1/4} \tag{65}$$

for $1 \leq l \leq \tilde{L}$

These weights are then used to enhance the spectral amplitudes for the current frame according to the relationship:

$$\overline{M}_l = \begin{cases} \bar{M}_l & \text{if } 8l \leq \tilde{L} \\ 1.2 \cdot \bar{M}_l & \text{else if } W_l > 1.2 \\ .5 \cdot \bar{M}_l & \text{else if } W_l < .5 \\ W_l \cdot \bar{M}_l & \text{otherwise} \end{cases} \quad \text{for } 1 \leq l \leq \tilde{L} \tag{66}$$

A final step is to scale the enhanced spectral amplitudes in order to remove any energy difference between the enhanced and unenhanced amplitudes. The correct scale factor, denoted by $\gamma$, is given below.

$$\gamma = \left[ \frac{R_{M0}}{\sum_{l=1}^{\tilde{L}} |\overline{M}_l|^2} \right]^{1/2} \tag{67}$$

This scale factor is applied to each of the enhanced spectral amplitudes as shown in Equation (68).

$$\overline{M}_l = \gamma \cdot \overline{M}_l \text{ for } 1 \leq l \leq \tilde{L} \tag{68}$$

For notational simplicity this equation refers to both the scaled and unscaled spectral amplitudes as $\overline{M}_l$. This convention has been adopted since the unscaled amplitudes are discarded and only the scaled amplitudes are subsequently used by the decoder during parameter smoothing and speech synthesis.

The value of $R_{M0}$ expressed in Equation (64) is a measure of the energy in the current frame. This value is used to update a local energy parameter in accordance with the following rule.

$$S_E(0) = \begin{cases} .95 \, S_E(-1) + .05 \, R_{M0} & \text{if } .95 \, S_E(-1) + .05 \, R_{M0} \geq 10000.0 \\ 10000.0 & \text{otherwise} \end{cases} \tag{69}$$

This equation generates the local energy parameter for the current frame, $S_E(0)$, from $R_{M0}$ and the value of the local energy parameter from the previous frame $S_E(-1)$. The parameter $S_E(0)$ is used to adaptively smooth the V/UV decisions as described below.

The IMBE™ decoder performs adaptive smoothing to reduce the perceived distortion caused by any uncorrectable bit errors in $\tilde{b}_0, \tilde{b}_1, \ldots, \tilde{b}_{L+2}$. The adaptive smoothing methods are controlled by two error rate parameters, $\epsilon_T$ and $\epsilon_R$, which are estimated for the current frame as discussed above. When $\epsilon_T$ and $\epsilon_R$ are small, it is assumed that the error control decoding removed all of the bit errors, and the decoded model parameters are not perturbed. Conversely, when $\epsilon_T$ and $\epsilon_R$ are small, it is assumed that their is a high probability that some uncorrected bit errors have been introduced into the decoded model parameters, and a large amount of smoothing is peformed.

The first parameters to be smoothed by the decoder are the V/UV decisions. First an adaptive threshold $V_M$ is calculated using equation (70), $$V_M = \begin{cases} \infty & \text{if } \epsilon_R(0) \leq .005 \text{ and } \epsilon_T \leq 4 \\ \frac{45.255 \, (S_E(0))^{.375}}{\exp(277.26\epsilon_R(0))} & \text{else if } \epsilon_R(0) \leq .0125 \text{ and } \epsilon_4 = 0 \\ 1.414 \, (S_E(0))^{.375} & \text{otherwise} \end{cases} \tag{70}$$

where the energy parameter $S_E(0)$ is defined in Equation (69). After the adaptive threshold is computed each enhanced spectral amplitude $\overline{M}_l$ for $1 \leq l \leq \tilde{L}$ is compared against $V_M$, and if $\overline{M}_l > V_M$ then the V/UV decision for that spectral amplitude is declared voiced, regardless of the decoded V/UV decision. Otherwise the decoded V/UV decision for that spectral amplitude is left unchanged. This process can be expressed mathematically as shown below.

$$\bar{v}_l = \begin{cases} 1 & \text{if } \overline{M}_l > V_M \\ \tilde{v}_l & \text{otherwise} \end{cases} \quad \text{for } 1 \leq l \leq \tilde{L} \tag{71}$$

Once V/UV decisions have been smoothed, the decoder adaptively smooths the spectral amplitudes. $\overline{M}_l$ for $1 \leq l \leq \tilde{L}$. The spectral amplitude smoothing method computes the following amplitude measure for the current segment.

$$A_M = \sum_{l=1}^{\tilde{L}} \overline{M}_l \tag{72}$$

Next an amplitude threshold is updated according to the following equation.

$$\tau_M(0) = \begin{cases} 20480 & \text{if } \epsilon_R(0) \leq .005 \text{ and } \epsilon_T(0) \leq 6 \\ 6000 - 300\epsilon_T + \tau_M(-1) & \text{otherwise} \end{cases} \tag{73}$$

where $\tau_M(0)$ and $\tau_M(-1)$ represent the value of the amplitude threshold for the current and previous frames respectively. The two parameters $A_M$ and $\tau_M(0)$ are then used to compute a scale for $\gamma_M$ given below.

$$\gamma_M = \begin{cases} 1.0 & \text{if } \tau_M(0) > A_M \\ \frac{\tau_M(0)}{A_M} & \text{otherwise} \end{cases} \tag{74}$$

Figure 12:
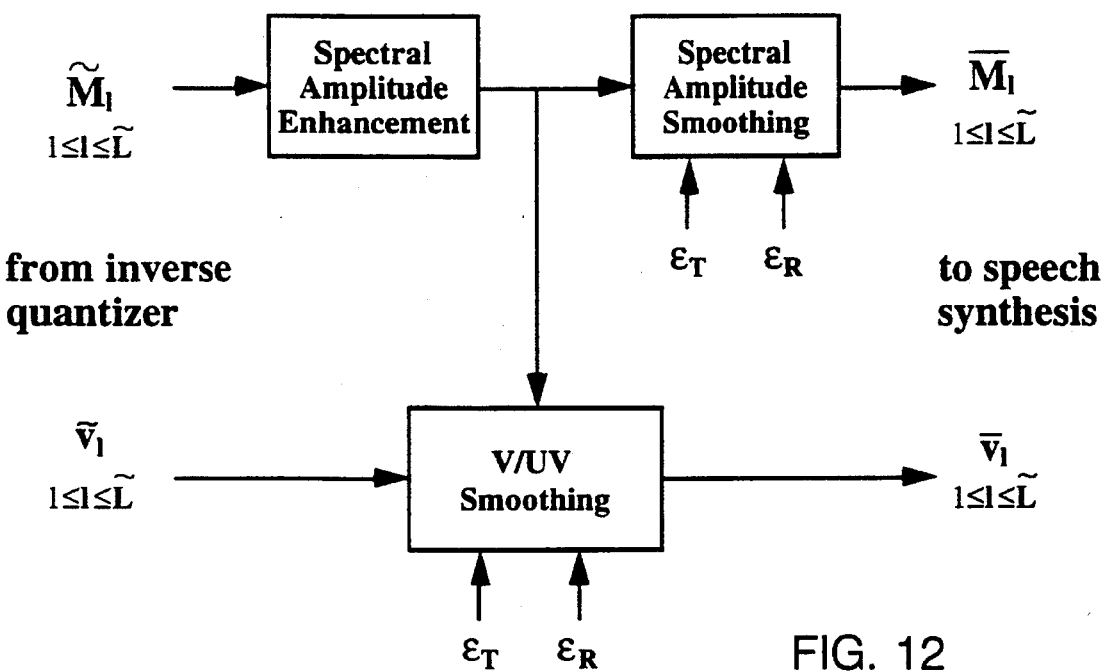
FIG. 12 is a block diagram showing a prefered embodiment of the invention in which the spectral amplitudes used in the IMBE™ speech coder are adaptively smoothed.
Figure 13:
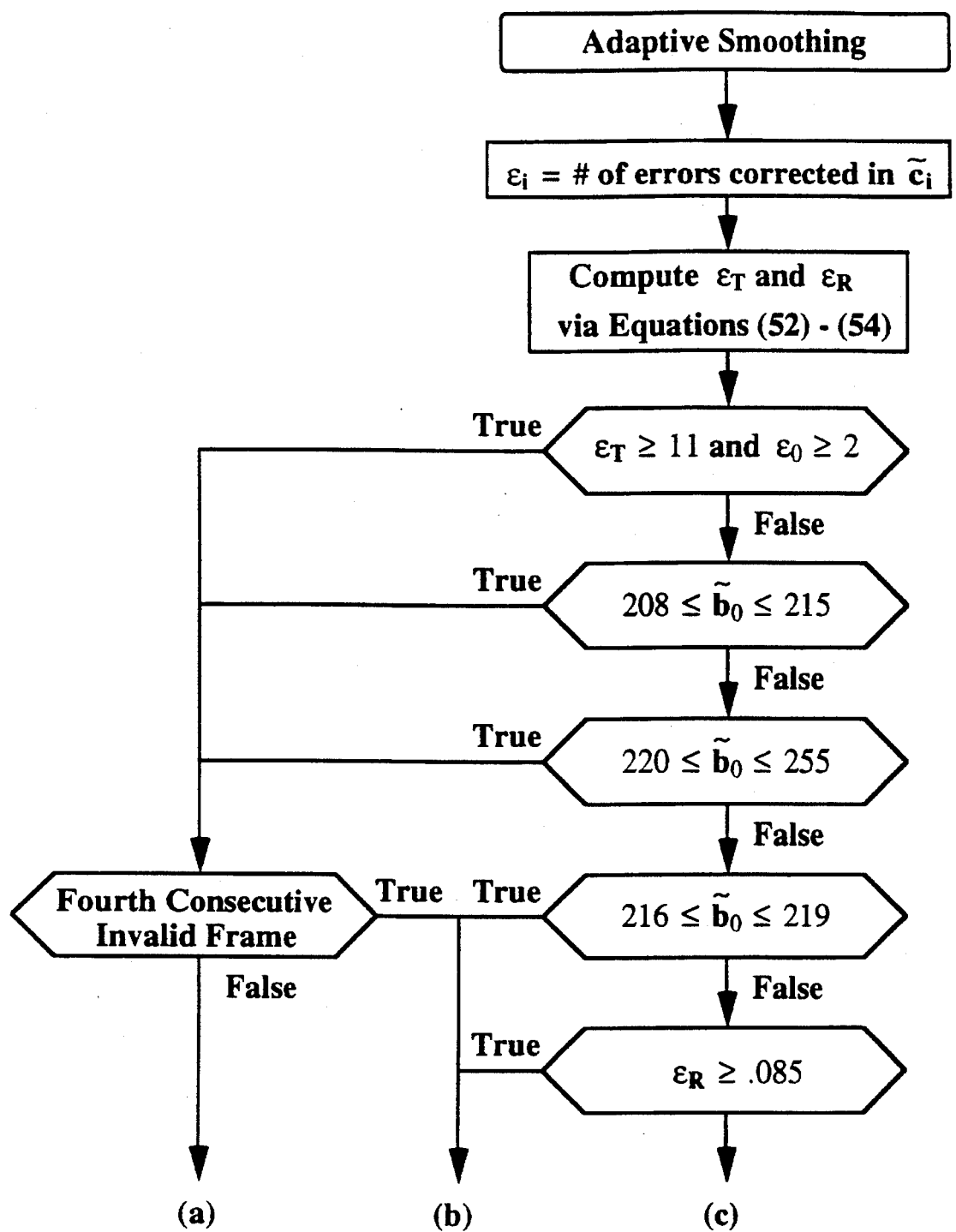
FIGS. 13 and 14 are flow charts showing a prefered embodiment of the invention in which the model parameters used in the IMBE™ speech coder are adaptively smoothed and in which frame repeats and frame mutes are performed if an error measure exceeds a threshold.
Figure 14:
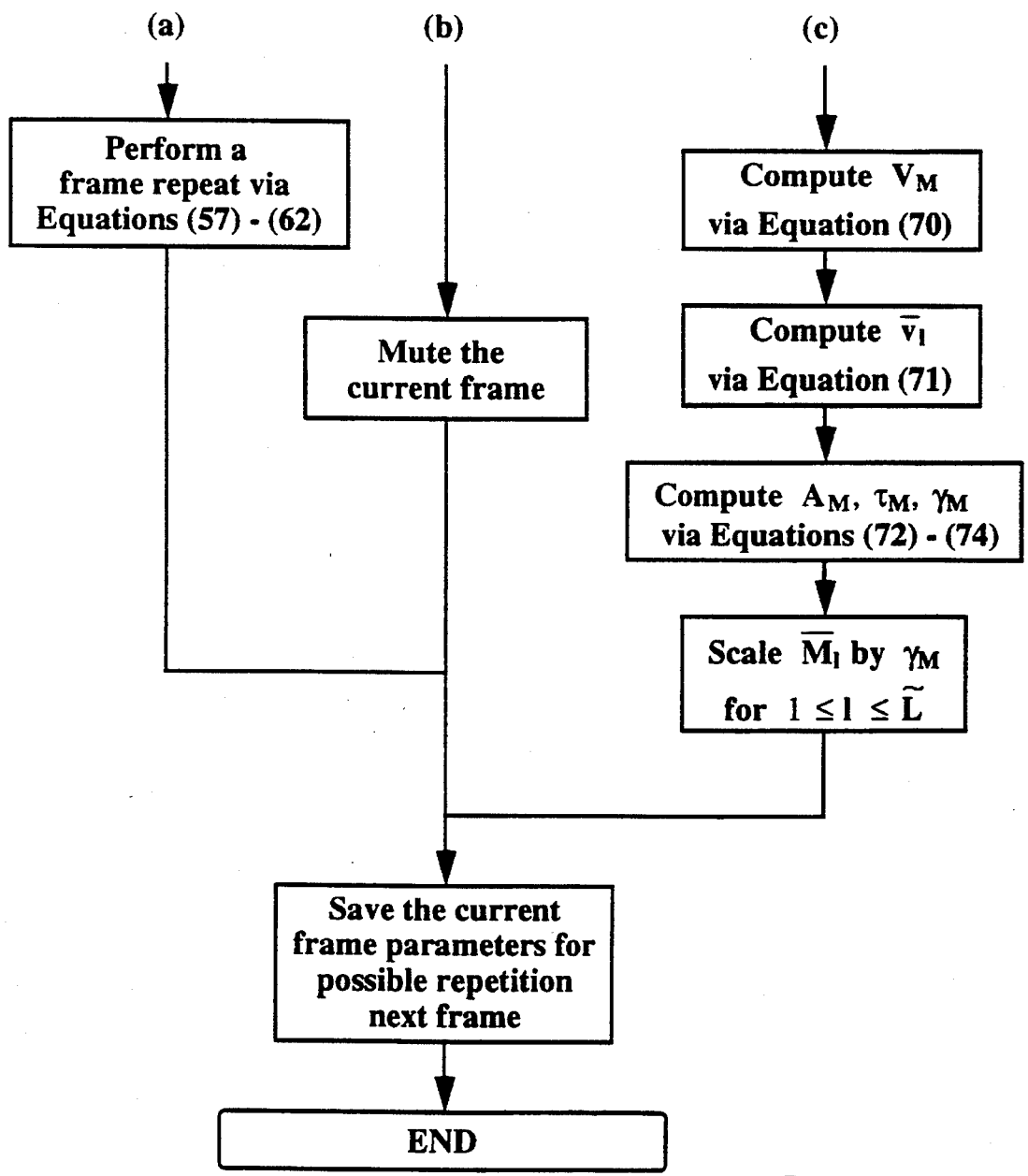
Figure 15:
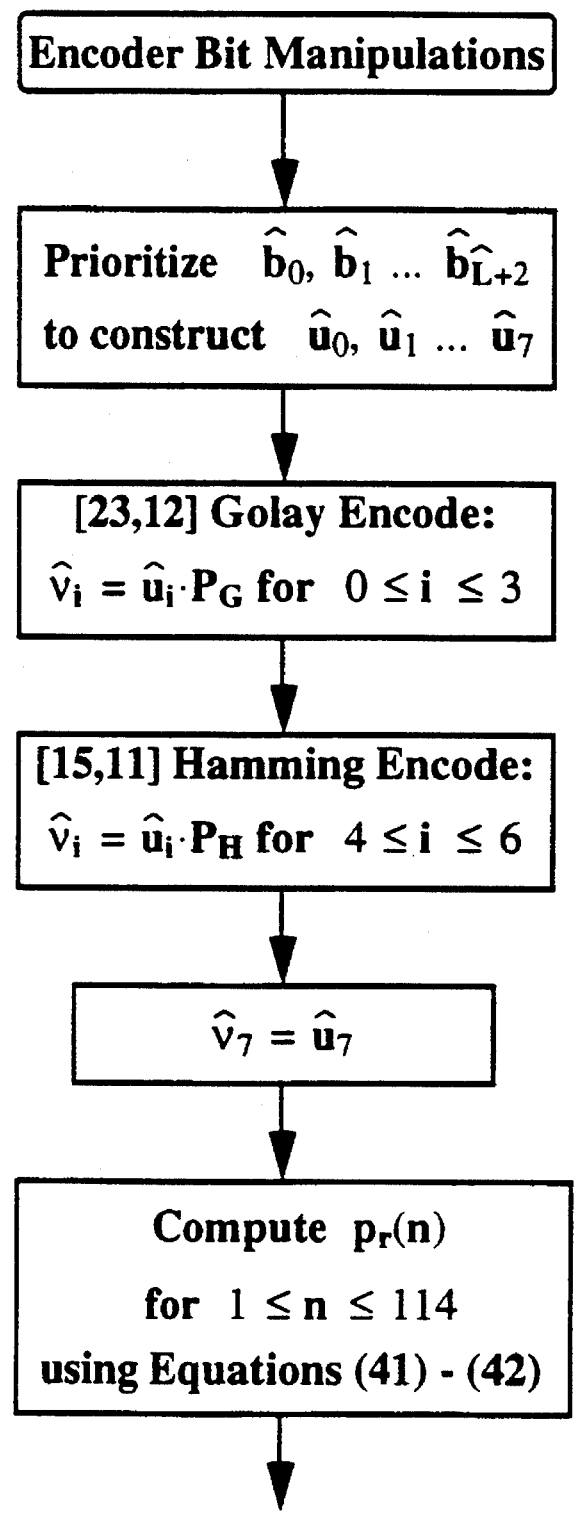
FIGS. 15 and 16 are flow charts showing a prefered embodiment of the invention in which the quantizer values representing a frame in the 7.2 kbps IMBE™ speech coder are encoded into a frame of digital data.
Figure 16:
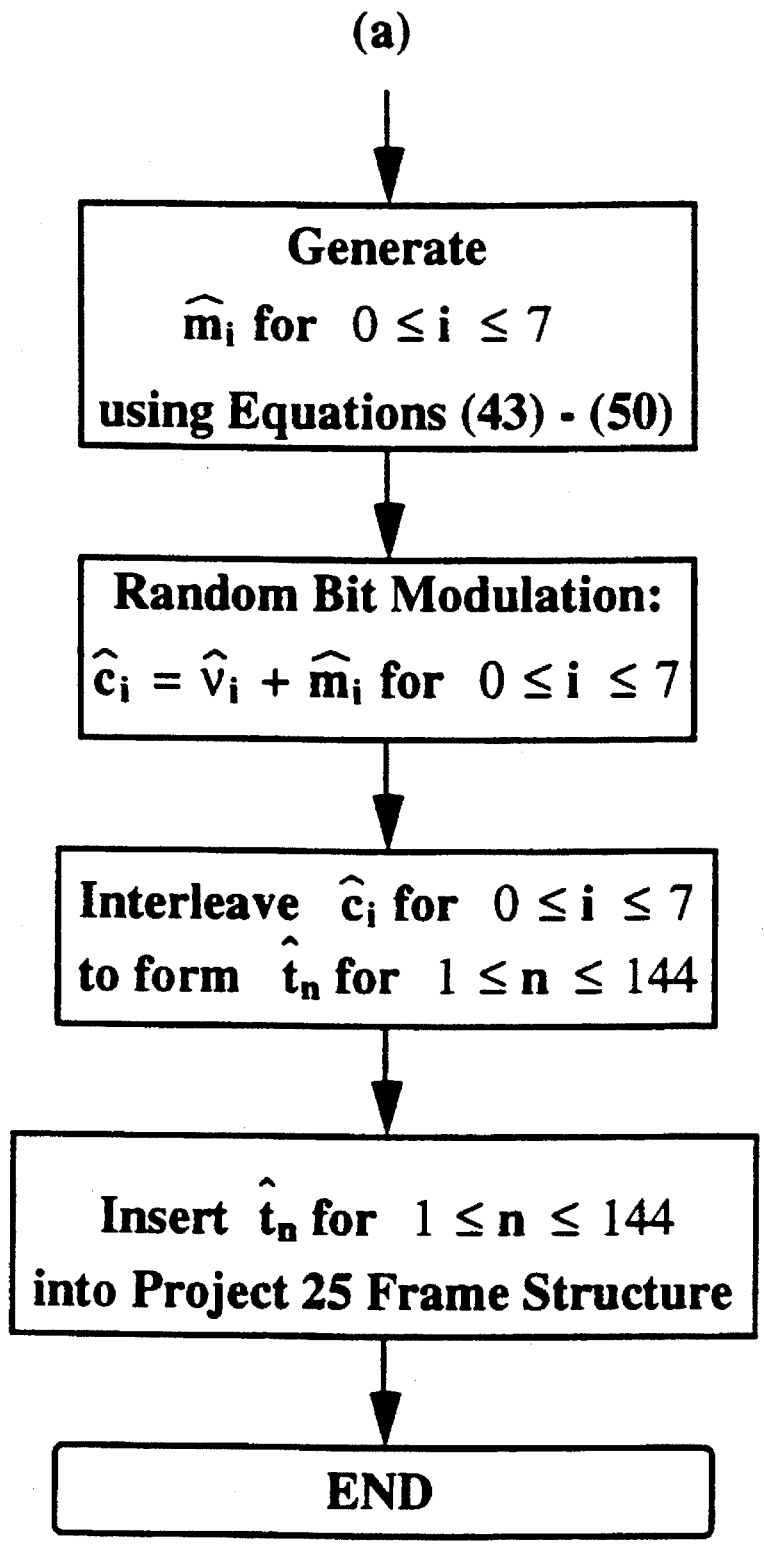
Figure 17:
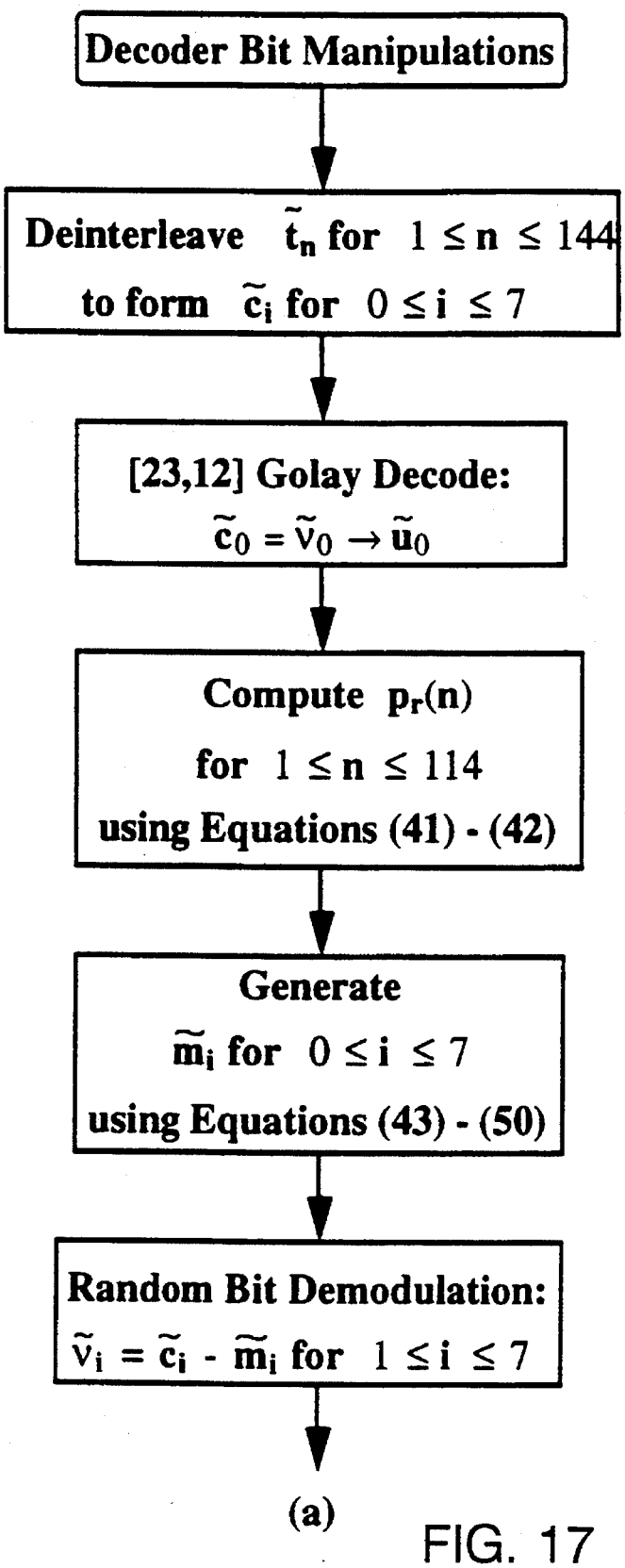
FIGS. 17 and 18 are flow charts showing a prefered embodiment of the invention in which the received data representing a frame in the 7.2 kbps IMBE™ speech coder is decoded into a set of bit encodings.
Figure 18:
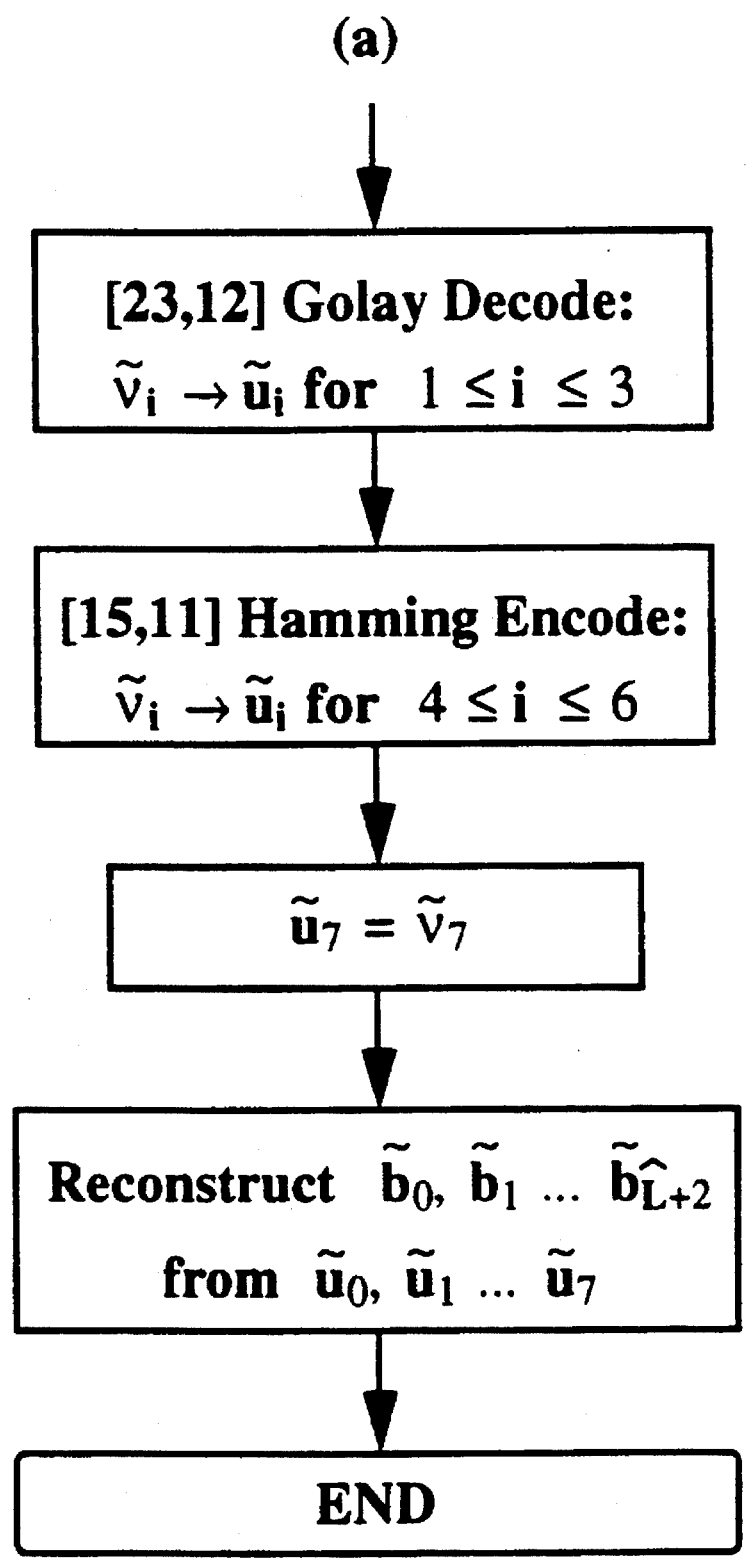

This scale factor is multiplied by each of the spectral amplitudes $\overline{M}_l$ for $1 \leq l \leq \tilde{L}$. Note that this step must be completed after spectral amplitude enhancement has been performed and after $V_M$ has been computed according to Equation 70. The correct sequence is shown in FIG. 12.

We claim:

1. A method for error control coding of digital data, the method comprising the steps of:

dividing said digital data into a plurality of bit vectors, including a first bit vector;

encoding said bit vectors with error control codes, to produce encoded bit vectors, including an encoded first bit vector;

generating a modulation key from at least said first bit vector; and using said modulation key to modulate at least some of said encoded bit vectors.

2. The method of claim 1 wherein said digital data comprises bits of varying priority, and wherein said first bit vector comprises a high priority bit vector containing bits of higher priority than at least some other said bits.

3. The method of claim 1 wherein said digital data is divided into frames, each frame comprising a said plurality of bit vectors.

4. The method of claim 2 wherein said digital data is divided into frames, each frame comprising a said plurality of bit vectors.

5. The method of claim 1 or 4 wherein a first group of said bit vectors are each encoded by a first type of error control code and a second group of said bit vectors are each encoded by a second type of error control code.

6. The method of claims 3 or 4 wherein said frames of digital data are generated by encoding a speech signal with a speech coder.

7. The method of claim 6 wherein said frames of digital data are grouped into a plurality of frame formats and wherein the said modulation key is generated from one of said bit vectors, said one bit vector determining the frame format used in the current frame.

8. A method of decoding digital data of the type encoded by an encoding method comprising the steps of:

dividing said digital data into a plurality of bit vectors, including a first bit vector;

encoding said bit vectors with error control codes, to produce encoded vectors, including an encoded first bit vector;

generating a modulation key from at least said first bit vector; and using said modulation key to modulate at least some of said encoded bit vectors, to produce modulated encoded bit vectors;

said method of decoding comprising the steps of:

dividing the digital data to be decoded into a plurality of code vectors, said code vectors corresponding to said modulated encoded bit vectors;

generating a demodulation key from at least one of said code vectors;

using said demodulation key to demodulate at least some of said code vectors, to produce demodulated code vectors; and error control decoding at least some of said demodulated code vectors.

9. The method of claim 8 further comprising the steps of:

computing an error measure which is formed at least in part by comparing said demodulated code vectors before error control decoding with said demodulated code vectors after error control decoding;

comparing the value of said error measure against a threshold; and declaring said frame invalid if said error measure exceeds said threshold.

10. The method of claim 9 wherein said demodulation is performed using a method comprising the steps of:

initializing a pseudo-random sequence using said demodulation key;

using said pseudo-random sequence to generate one or more binary demodulation vectors; and performing modulo 2 addition of said binary demodulation vectors to a plurality of said code vectors.

11. The method of claim 10 wherein said demodulation key is generated from one of said code vectors after said one code vector has been error control decoded.

12. The method of claims 8, 9, 10 or 11 wherein a first group of said demodulated code vectors are each decoded using a first type of error control code and a second group of said demodulated code vectors are each decoded using a second type of error control code.

13. The method of claim 12 wherein said first type of error control code is a Golay code and said second type of error control code is a Hamming code.

14. The method of claims 8, 9, 10 or 11 wherein said digital data comprises code vectors of varying priority, and wherein said demodulation key is generated from a high priority code vector.

15. The method of claims 9, 10 or 11 wherein said error measure is computed at least in part by counting the number of errors detected or corrected by said error control decoding.

16. The method of claim 14 wherein said frames of digital data represent a speech signal which has been encoded with a speech coder.

17. The method of claim 16 wherein said frames of digital data are grouped into a plurality of frame formats and wherein said demodulation key is generated from one of said code vectors, said one code vector determining the frame format used in each frame.

18. The method of claim 16 wherein said demodulation key is generated from one of said code vectors, said one code vector representing at least in part the level of said speech signal.

19. The method of claim 16 wherein said invalid frames are discarded and replaced by the last decoded frame which was not declared to be invalid.

20. The method of claim 16 wherein said speech coder is one of the following speech coders: Multi-Band Excitation (MBE) speech coder, Improved Multi-Band Excitation (IMBE™) speech coder, or sinusoidal transform speech coder (STC).

* * * * *